(12) United States Patent
Hsu et al.

(10) Patent No.: US 10,818,651 B2
(45) Date of Patent: Oct. 27, 2020

(54) PACKAGE STRUCTURE

(71) Applicant: Taiwan Semiconductor Manufacturing Co., Ltd., Hsinchu (TW)

(72) Inventors: Sen-Kuei Hsu, Kaohsiung (TW); Hsin-Yu Pan, Taipei (TW); Ming-Hsien Tsai, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/260,115

(22) Filed: Jan. 29, 2019

(65) Prior Publication Data

US 2020/0243497 A1    Jul. 30, 2020

(51) Int. Cl.
| | |
|---|---|
| H01L 25/18 | (2006.01) |
| H01L 23/538 | (2006.01) |
| H01L 23/522 | (2006.01) |
| H01L 23/00 | (2006.01) |
| H01L 23/36 | (2006.01) |
| H01L 23/31 | (2006.01) |

(52) U.S. Cl.
CPC .......... *H01L 25/18* (2013.01); *H01L 23/3128* (2013.01); *H01L 23/36* (2013.01); *H01L 23/5226* (2013.01); *H01L 23/5383* (2013.01); *H01L 23/5386* (2013.01); *H01L 24/09* (2013.01); *H01L 24/17* (2013.01); *H01L 24/49* (2013.01); *H01L 24/73* (2013.01); *H01L 2224/02373* (2013.01); *H01L 2224/02379* (2013.01); *H01L 2224/0401* (2013.01); *H01L 2224/73257* (2013.01); *H01L 2924/1205* (2013.01)

(58) Field of Classification Search
CPC ..... H01L 25/18; H01L 23/3128; H01L 23/36; H01L 23/5226; H01L 23/5383; H01L 23/5386; H01L 24/09; H01L 24/17; H01L 24/49; H01L 24/73; H01L 2224/02373; H01L 2224/02379; H01L 2224/0401; H01L 2224/73257; H01L 2924/1205
USPC ........................................................ 257/690
See application file for complete search history.

(56) References Cited

U.S. PATENT DOCUMENTS

| | | |
|---|---|---|
| 8,993,380 B2 | 3/2015 | Hou et al. |
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |

(Continued)

*Primary Examiner* — Tu-Tu V Ho
(74) *Attorney, Agent, or Firm* — JCIPRNET

(57) ABSTRACT

A package structure includes an insulating encapsulation, a semiconductor die, and a filter structure. The semiconductor die is encapsulated in the insulating encapsulation. The filter structure is electrically coupled to the semiconductor die, wherein the filter structure includes a patterned metallization layer with a pattern having a double-spiral having aligned centroids thereof.

20 Claims, 20 Drawing Sheets

(56) References Cited

U.S. PATENT DOCUMENTS

| | | | |
|---|---|---|---|
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2014/0318611 A1* | 10/2014 | Moslehi | H01L 31/022441 |
| | | | 136/256 |
| 2017/0133351 A1* | 5/2017 | Su | H01L 24/20 |
| 2019/0393051 A1* | 12/2019 | Kawano | H01L 21/561 |

* cited by examiner

PACKAGE STRUCTURE

BACKGROUND

Semiconductor devices and integrated circuits are typically manufactured on a single semiconductor wafer. The dies of the wafer may be processed and packaged with other semiconductor devices or dies at the wafer level, and various technologies have been developed for the wafer level packaging. Over the past decades, the semiconductor industry has continually improved the processing capabilities and power consumption of the semiconductor devices and the integrated circuits by shrinking the minimum feature size. Signal and integrity and power integrity become increasingly important to the performance and reliability of devices within a package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
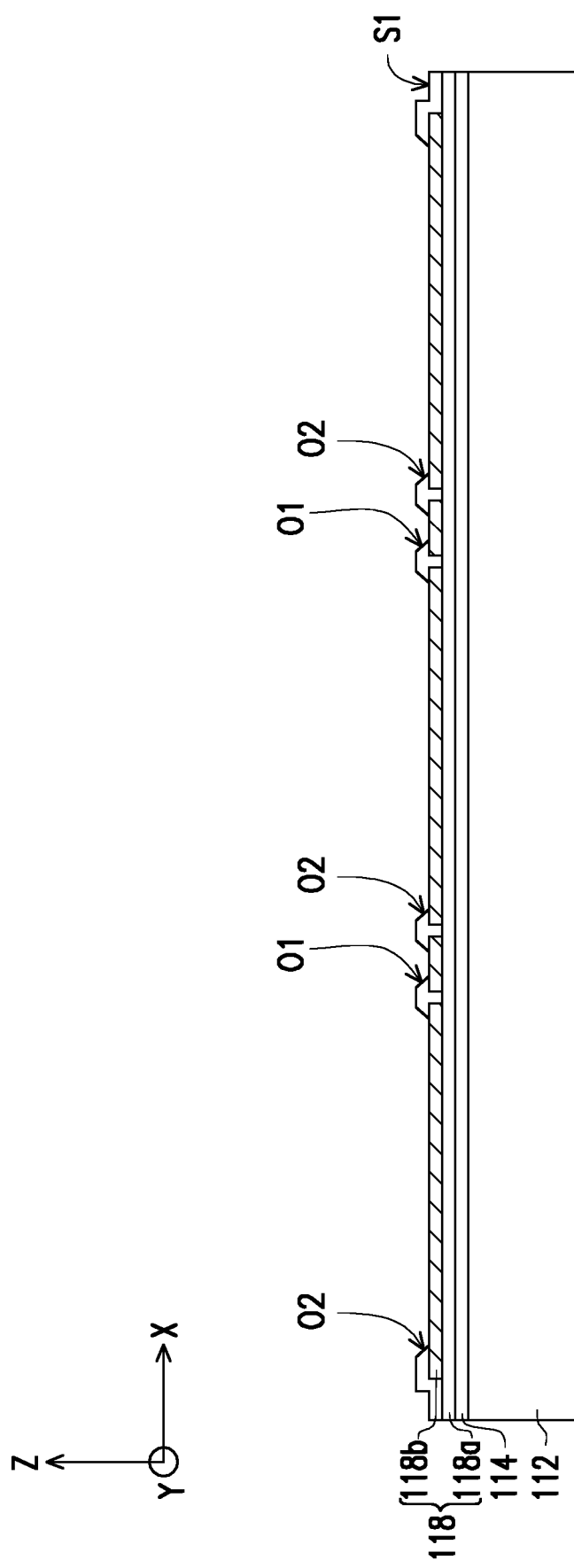
FIG. 1 to FIG. 12 are schematic cross-sectional views of various stages in a manufacturing method of a package structure according to some embodiments of the disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 12 are schematic cross-sectional views of various stages in a manufacturing method of a package structure according to some embodiments of the disclosure. FIG. 13A to FIG. 13L are schematic top views respectively illustrating a relative position among dies of a package structure according to some embodiments of the disclosure. In addition, FIG. 1 to FIG. 12 are the schematic cross-sectional views taken along a cross-sectional line A-A depicted in FIG. 13A. In embodiments, the manufacturing method is part of a wafer level packaging process. It is to be noted that the process steps described herein cover a portion of the manufacturing processes used to fabricate a package structure. The embodiments are intended to provide further explanations but are not used to limit the scope of the present disclosure. In FIG. 1 to FIG. 12, more than one (semiconductor) chips or dies are shown to represent plural (semiconductor) chips or dies of the wafer, and a first package 10 and a second package 20 are shown to represent a package structure PS1 obtained following the manufacturing method, for example. In other embodiments, one or more than one (semiconductor) chips or dies are shown to represent plural (semiconductor) chips or dies of the wafer, and one or more than one first and second packages 10, 20 are shown to represent plural (semiconductor) package structures PS1 obtained following the (semiconductor) manufacturing method, the disclosure is not limited thereto.

Referring to FIG. 1, in some embodiments, a carrier 112 is provided. In some embodiments, the carrier 112 may be a glass carrier or any suitable carrier for carrying a semiconductor wafer or a reconstituted wafer for the manufacturing method of the semiconductor package. In some embodiments, the carrier 112 is coated with a debond layer 114. The material of the debond layer 114 may be any material suitable for bonding and debonding the carrier 112 from the above layer(s) or any wafer(s) disposed thereon.

In some embodiments, the debond layer 114 may include a dielectric material layer made of a dielectric material including any suitable polymer-based dielectric material (such as benzocyclobutene (BCB), polybenzoxazole (PBO)). In an alternative embodiment, the debond layer 114 may include a dielectric material layer made of an epoxy-based thermal-release material, which loses its adhesive property when heated, such as a light-to-heat-conversion (LTHC) release coating film. In a further alternative embodiment, the debond layer 114 may include a dielectric material layer made of an ultra-violet (UV) glue, which loses its adhesive property when exposed to UV lights. In certain embodiments, the debond layer 114 may be dispensed as a liquid and cured, or may be a laminate film laminated onto the carrier 112, or may be the like. The top surface of the debond layer 114, which is opposite to a bottom surface contacting the carrier 112, may be levelled and may have a high degree of coplanarity. In certain embodiments, the debond layer 114 is, for example, a LTHC layer with good chemical resistance, and such layer enables room temperature debonding from the carrier 112 by applying laser irradiation, however the disclosure is not limited thereto.

In an alternative embodiment, a buffer layer (not shown) may be coated on the debond layer 114, where the debond layer 114 is sandwiched between the buffer layer and the carrier 112, and the top surface of the buffer layer may further provide a high degree of coplanarity. In some embodiments, the buffer layer may be a dielectric material layer. In some embodiments, the buffer layer may be a polymer layer which made of polyimide, PBO, BCB, or any other suitable polymer-based dielectric material. In some embodiments, the buffer layer may be Ajinomoto Buildup Film (ABF), Solder Resist film (SR), or the like. In other words, the buffer layer is optional and may be omitted based on the demand, so that the disclosure is not limited thereto.

Continued on to FIG. 1, in some embodiments, a redistribution circuit structure 118 is formed over the carrier 112. For example, in FIG. 1, the redistribution circuit structure 118 is formed on the debond layer 114, and the formation of the redistribution circuit structure 118 includes sequentially forming one or more dielectric layers 118a and one or more metallization layers 118b in alternation. In some embodiments, the redistribution circuit structure 118 includes two dielectric layers 118a and one metallization layer 118b as shown in FIG. 1, where the metallization layer 118b is sandwiched between the dielectric layers 118a, and portions of a top surface of the metallization layer 118b are respectively exposed by the openings of a topmost layer of the dielectric layers 118a. However, the disclosure is not limited thereto. The numbers of the dielectric layers 118a and the metallization layer 118b included in the redistribution circuit structure 118 is not limited thereto, and may be designated and selected based on the demand. For example, the numbers of the dielectric layers 118a and the metallization layer 118b may be one or more than one.

In certain embodiments, the portions of a top surface of the metallization layer 118b are exposed by openings O1 and openings O2 formed in the topmost layer of the dielectric layers 118a, as shown in FIG. 1. For example, the topmost layer of the dielectric layers 118a includes two openings O1 and three openings O2 as shown in FIG. 1, where the openings O1 and the openings O2 are laterally arranged on the carrier 112. In some embodiments, the openings O2 each are surrounded by and separated from the openings O1. However, the disclosure is not limited thereto. The numbers of the openings O1 and the openings O2 formed in the topmost layer of the dielectric layers 118a is not limited thereto, and may be designated and selected based on the demand.

In certain embodiments, the material of the dielectric layers 118a may be polyimide, PBO, BCB, a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the material of the dielectric layers 118a formed by suitable fabrication techniques such as spin-on coating process, chemical vapor deposition (CVD) process, plasma-enhanced chemical vapor deposition (PECVD) process or the like. The disclosure is not limited thereto.

In some embodiments, the material of the metallization layer 118b may be made of conductive materials formed by electroplating or deposition, such as aluminum, titanium, copper, nickel, tungsten, and/or alloys thereof, which may be patterned using a photolithography and etching process. In some embodiments, the metallization layer 118b may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Figure 2:
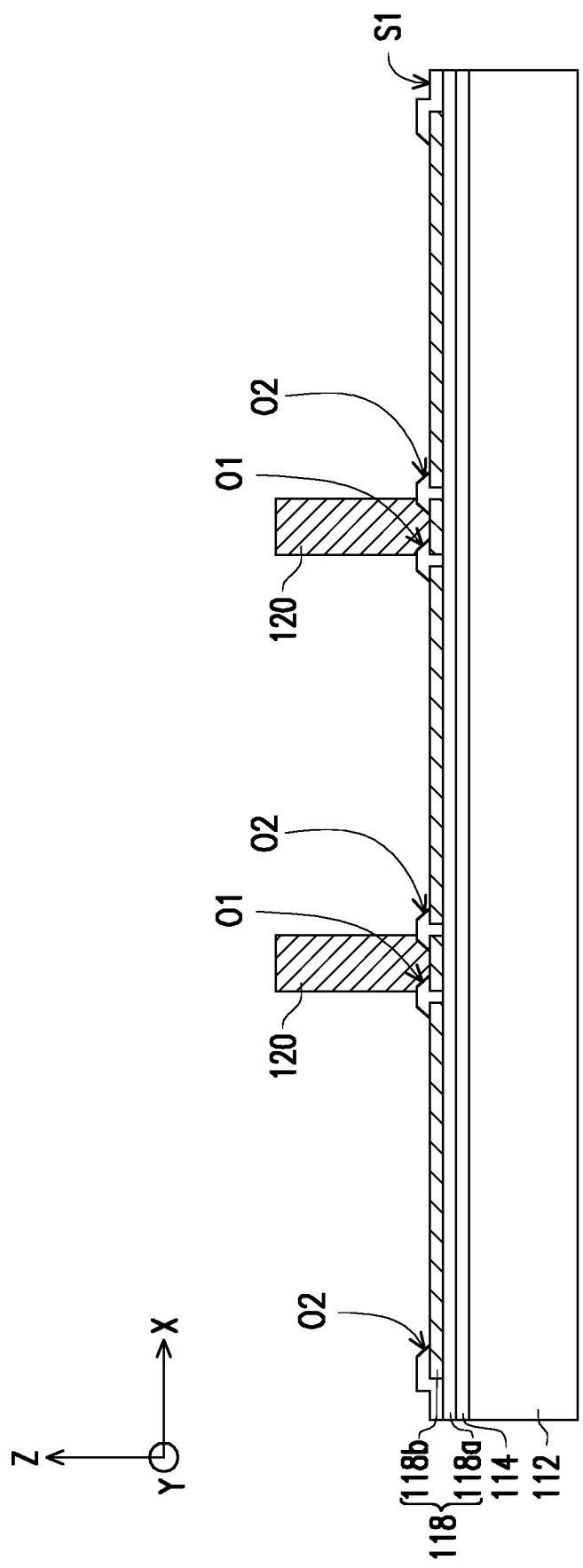

Referring to FIG. 2, in some embodiments, through vias 120 are formed on the redistribution circuit structure 118 (e.g. a first side S1 of the redistribution circuit structure 118). In some embodiments, the through vias 120 may be through integrated fan-out (InFO) vias. In some embodiments, the through vias 122 are arranged along but not on a cutting line (not shown) between two package structures 10. For simplification, only two through vias 120 are presented in FIG. 2 for illustrative purposes, however it should be noted that more than two through vias may be formed; the disclosure is not limited thereto. The number of the through vias 120 may be designated and selected based on the demand, and adjusted by changing the number of the openings O1.

In some embodiments, the through vias 120 are formed by photolithography, plating, photoresist stripping processes or any other suitable method. For example, the plating process may include an electroplating plating, an electroless plating, or the like. In one embodiment, the through vias 120 may be formed by forming a mask pattern (not shown) covering the redistribution circuit structure 118 with openings exposing the top surface of the metallization layer 118b exposed by the openings O1 formed in the topmost layer of the dielectric layers 118a, forming a metallic material filling the openings formed in the mask pattern and the openings O1 to form the through vias 120 by electroplating or deposition and then removing the mask pattern. In one embodiment, the mask pattern may be removed by acceptable ashing process and/or photoresist stripping process, such as using an oxygen plasma or the like. In one embodiment, prior to the formation of the mask pattern, a seed layer may be formed conformally over the redistribution circuit structure. The disclosure is not limited thereto. In one embodiment, the material of the through vias 120 may include a metal material such as copper or copper alloys, or the like. However, the disclosure is not limited thereto.

In alternative embodiments, the through vias 120 may be pre-fabricated through vias which may be disposed on the redistribution circuit structure 118 by picking- and placing.

Figure 3:
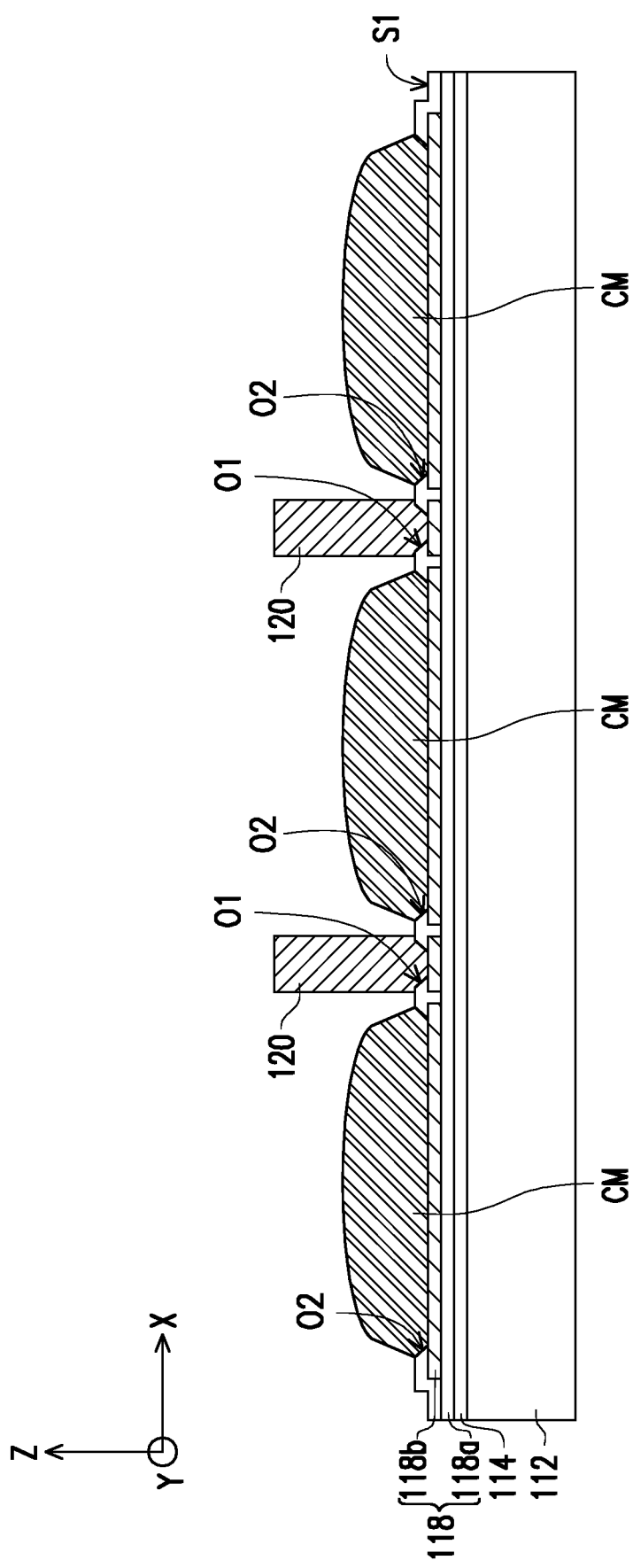

Referring to FIG. 3, in some embodiments, a connecting material CM is provided and formed over the redistribution circuit structure 118. The connecting material CM is, for example, conductive adhesive (such as silver paste, solder paste or the like), and is formed by coating, screen printing, or dispensing. However, the disclosure is not limited thereto. As shown in FIG. 3, in some embodiments, the connecting material CM is formed on the redistribution circuit structure 118 and at least fills up the openings O2, where the connecting material CM is at least in contact with the metallization layer 118b but not in contact with the through vias 120. In an alternative embodiment, the connecting material CM may be further in contact with the topmost layer of the dielectric layers 118a located around the openings O2 in addition to the metallization layer 118b.

Figure 4:
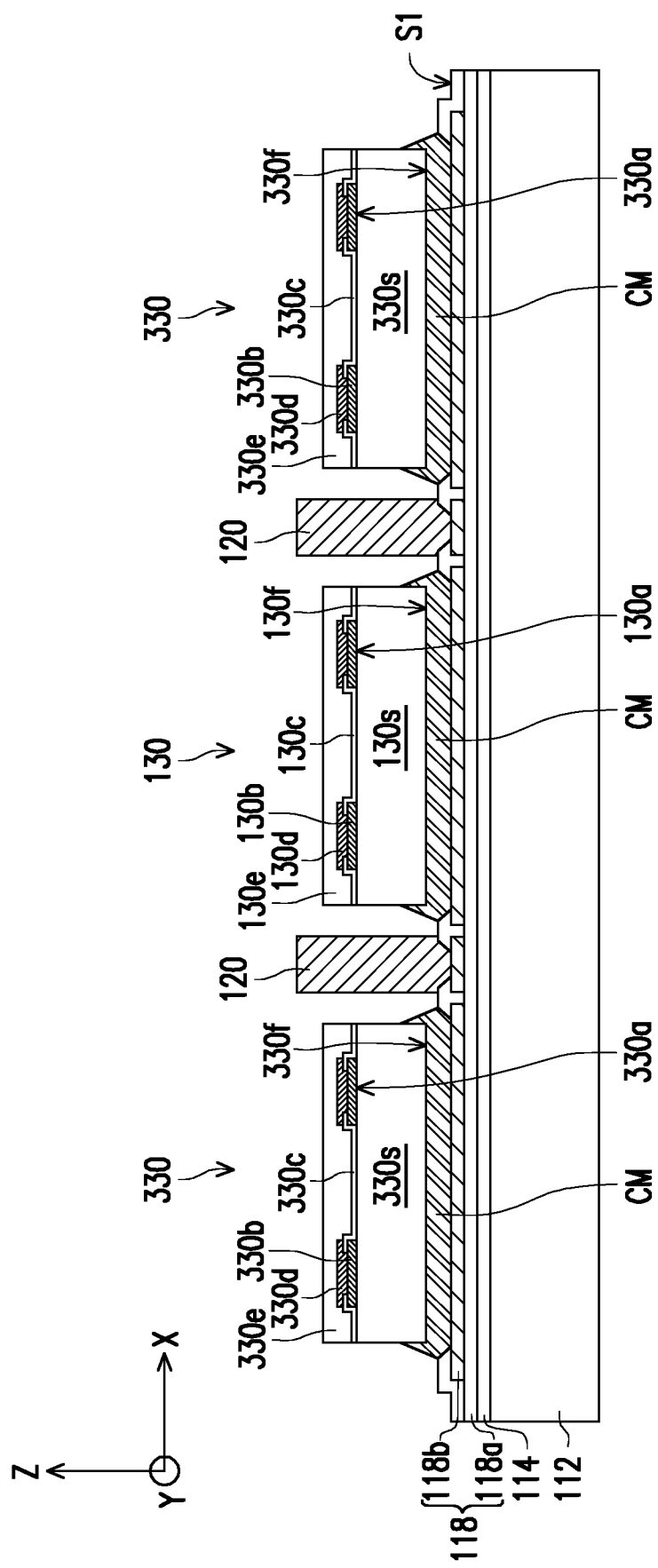
Figure 13A:
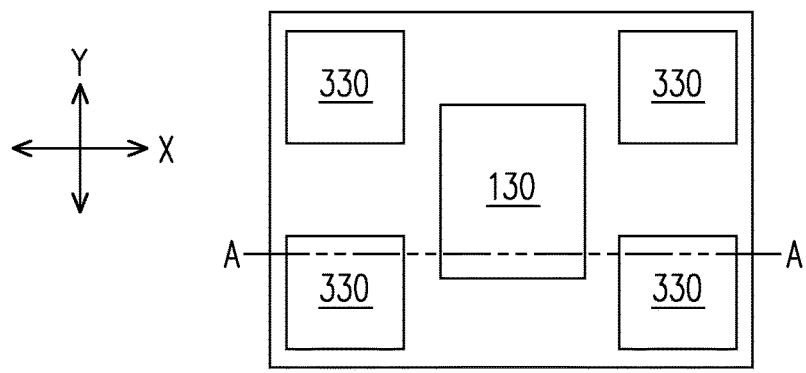
FIG. 13A to FIG. 13L are schematic top views respectively illustrating a relative position between semiconductor dies of a package structure according to some embodiments of the disclosure.
Figure 13B:
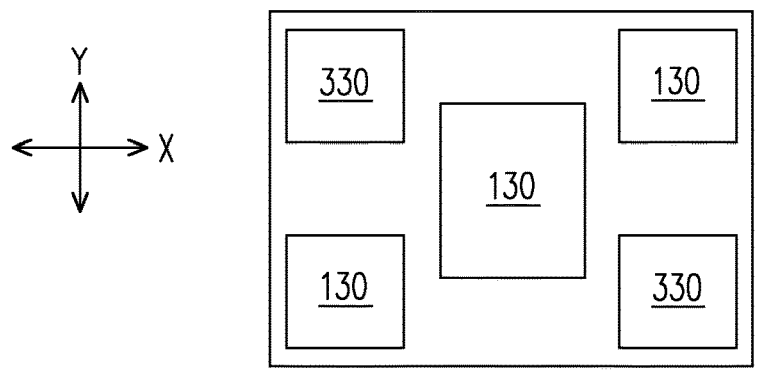
Figure 13C:
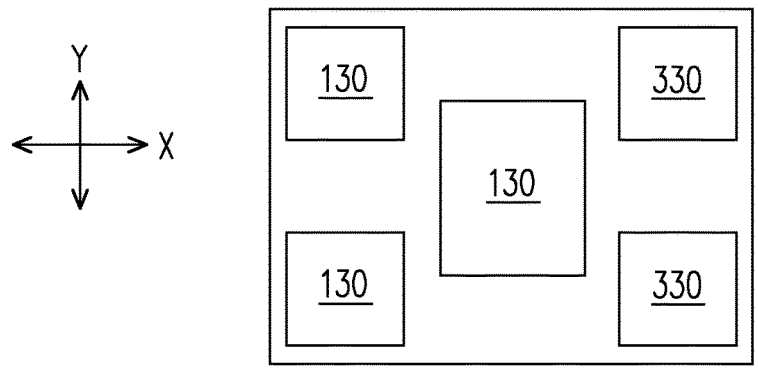

Referring to FIG. 4, in some embodiments, one or more than one dies are provided, where the one or more than one dies may include one or more than one active dies and one or more than one dummy dies. For illustration purpose, one semiconductor die 130 and four dummy dies 330 are shown in FIG. 4 and FIG. 13A, however the disclosure is not limited thereto. It should be noted that one or more than one semiconductor dies 130 and/or one or more than one dummy dies 330 may be provided.

For example, as shown in FIG. 4, the semiconductor die 130 is provided, and is picked and placed over the redistribution circuit structure 118, however the disclosure is not limited thereto. In the disclosure, the semiconductor die 130 is an active die/chip. In some embodiments, the semiconductor die 130 is disposed on the redistribution circuit structure 118 (e.g. the first side S1 of the redistribution circuit structure 118) and over the carrier 112 through the connecting material CM. In some embodiments, the connecting material CM is located between the semiconductor die 130 and the redistribution circuit structure 118, and the connecting material CM physically contacts a backside surface 130f of the semiconductor die 130 and the redistribution circuit structure 118 (e.g. the topmost layer of the dielectric layers 118a of the redistribution circuit structure 118). In some embodiments, due to the connecting material CM provided between the semiconductor die 130 and the redistribution circuit structure 118, the semiconductor die 130 and the redistribution circuit structure 118 are stably adhered to each other. In some embodiments, the connecting material CM further physically contacts at least a portion of a sidewall of the semiconductor die 130. In some embodiments, the redistribution circuit structure 118 is referred to as a back-side redistribution layer of the semiconductor die 130.

In some embodiments, as shown in FIG. 4, the semiconductor die 130 includes a semiconductor substrate 130s having an active surface 130a and the backside surface 130f opposite to the active surface 130a, a plurality of pads 130b distributed on the active surface 130a, a passivation layer 130c covering the active surface 130a and a portion of the pad 130b, a plurality of conductive pillars 130d connected to the portion of the pads 130b, and a protection layer 130e covering the pads 130b and the conductive pillars 130d. In one embodiment, the material of the semiconductor substrate 130s may include a silicon substrate including active components (e.g., transistors and/or memories such as N-type metal-oxide semiconductor (NMOS) and/or P-type metal-oxide semiconductor (PMOS) devices, or the like) and/or passive components (e.g., resistors, capacitors, inductors or the like) formed therein. In some embodiments, such active components and passive components may be formed in a front-end-of-line (FEOL) process. In an alternative embodiment, the semiconductor substrate 130s may be a bulk silicon substrate, such as a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant or a combination thereof. The disclosure is not limited thereto.

In one embodiment, the pads 130b are partially exposed by the passivation layer 130c, the conductive pillars 130d are disposed on and electrically connected to the pads 130b, and the protection layer 130e covers the passivation layer 130c and the conductive pillars 130d for providing protection to the conductive pillars 130d from damages caused by die transportation and/or pick-and-place processes. In one embodiment, the pads 130b, the passivation layer 130c, the conductive pillars 130d, and the protection layer 130e may be formed in a back-end-of-line (BEOL) process. In some embodiments, the pads 130b may be aluminum pads or other suitable metal pads. In some embodiments, the conductive pillars 130d are copper pillars, copper alloy pillar or other suitable metal pillars, for example. In some embodiments, the passivation layer 130c and/or the protection layer 130e may be a PBO layer, a polyimide (PI) layer or other suitable polymers. In some alternative embodiments, the passivation layer 130c and/or the protection layer 130e may be made of inorganic materials, such as silicon oxide, silicon nitride, silicon oxynitride, or any suitable dielectric material. In certain embodiments, the materials of the passivation layer 130c and the protection layer 130e may be the same or different, the disclosure is not limited thereto.

In an alternative embodiment, the semiconductor die 130 may exclude the conductive pillars 130d and the protection layer 130e. In other words, the conductive pillars 130d and the protection layer 130e may be omitted. For example, the semiconductor die 130 may include the pads 130b distributed on the active surface 130a of the semiconductor substrate 130s and the passivation layer 130c covering the active surface 130a and a portion of the pad 130b. The disclosure is not limited thereto.

In some embodiments, the semiconductor die 130 described herein may be referred to as a chip or an integrated circuit (IC). In some embodiments, the semiconductor die 130 includes at least one wireless and radio frequency (RF) chip. In some embodiments, the semiconductor die 130 may further include additional chip(s) of the same type or different types. For example, in an alternative embodiment, more than one semiconductor die 130 are provided, and the semiconductor dies 130, except for including at least one wireless and RF chip, may include the same or different types of chips selected from digital chips, analog chips or mixed signal chips, application-specific integrated circuit (ASIC) chips, sensor chips, memory chips, logic chips or voltage regulator chips. In an alternative embodiment, the semiconductor die 130 may be referred to as a chip or an IC of combination-type, and the semiconductor die 130 may be a WiFi chip simultaneously including both of a RF chip and a digital chip. The disclosure is not limited thereto.

For example, as shown in FIG. 4, the dummy dies 330 are provided, and are picked and placed over the redistribution circuit structure 118, however the disclosure is not limited thereto. In the disclosure, the dummy dies 330 each are an dummy die/chip. In some embodiments, the dummy dies 330 are disposed on the redistribution circuit structure 118 (e.g. the first side S1 of the redistribution circuit structure 118) and over the carrier 112 through the connecting material CM. In some embodiments, the connecting material CM is located between the dummy dies 330 and the redistribution circuit structure 118, and the connecting material CM physically contacts a backside surface 330f of the dummy dies 330 and the redistribution circuit structure 118 (e.g. the topmost layer of the dielectric layers 118a of the redistribution circuit structure 118). In some embodiments, due to the connecting material CM provided between the dummy dies 330 and the redistribution circuit structure 118, the dummy dies 330 and the redistribution circuit structure 118 are stably adhered to each other. In some embodiments, the connecting material CM further physically contacts at least a portion of a sidewall of each dummy die 330.

In some embodiments, as shown in FIG. 4, the dummy dies 330 each include a semiconductor substrate 330s having an active surface 330a and the backside surface 330f opposite to the active surface 330a, a plurality of pads 330b distributed on the active surface 330a, a passivation layer 330c covering the active surface 330a and a portion of the pad 330b, a plurality of conductive pillars 330d connected to the portion of the pads 330b, a protection layer 330e covering the pads 330b and the conductive pillars 330d, and a capacitor electrically connected to the conductive pillars 330d.

In one embodiment, the capacitor (not illustrated) is partially embedded in the semiconductor substrate 330s and electrically connected to the conductive pillars 330d. In the disclosure, the capacitor includes a metal oxide semiconductor (MOS) capacitor; and for simplicity, the detailed structure of the capacitor is omitted from the drawings. The capacitor, for example, include the MOS capacitor having a structure with a gate structure overlying a gate dielectric structure, a spacer structure lining sidewalls of the gate structure, and source/drain regions laterally spaced on opposite sides of a channel region underlying the gate structure. The source/drain regions may be, for example, doped regions of the semiconductor substrate 330s and/or may be, for example, electrically connected to some conductive pillars 330d. The gate dielectric structure may be, for example, silicon dioxide or some other dielectric, and the spacer structure may be, for example, silicon nitride or some other dielectric. The gate structure may be, for example, electrically connected to other conductive pillars 330d and/ or may be, for example, doped polysilicon or a metal. The number of the capacitor may be one or more than one, the disclosure is not limited thereto. In some embodiments, as one dummy die 330 has a positioning area of 25 mm$^2$, a capacitance of the capacitor included therein is substantially equal to 400 nF.

In one embodiment, the material of the semiconductor substrate 330s may include a silicon substrate including additional passive components (e.g., resistors, inductors, or the like). In some embodiments, such passive components may be formed in a FEOL process. In an alternative embodiment, the semiconductor substrate 330s may be a bulk silicon substrate, such as a bulk substrate of monocrystalline silicon, a doped silicon substrate, an undoped silicon substrate, or a SOI substrate, where the dopant of the doped silicon substrate may be an N-type dopant, a P-type dopant or a combination thereof.

In one embodiment, the pads 330b are partially exposed by the passivation layer 330c, the conductive pillars 330d are disposed on and electrically connected to the pads 330b, and the protection layer 330e covers the passivation layer 330c and the conductive pillars 330d for providing protection to the conductive pillars 330d from damages caused by die transportation and/or pick-and-place processes. In one embodiment, the pads 330b, the passivation layer 330c, the conductive pillars 330d, and the protection layer 330e may be formed in a BEOL process. In some embodiments, the pads 330b may be aluminum pads or other suitable metal pads. In some embodiments, the conductive pillars 330d are copper pillars, copper alloy pillar or other suitable metal pillars, for example. In some embodiments, the passivation layer 330c and/or the protection layer 330e may be a PBO layer, a PI layer or other suitable polymers. In some alternative embodiments, the passivation layer 330c and/or the protection layer 330e may be made of inorganic materials, such as silicon oxide, silicon nitride, silicon oxynitride, or any suitable dielectric material. In certain embodiments, the materials of the passivation layer 330c and the protection layer 330e may be the same or different, the disclosure is not limited thereto.

In an alternative embodiment, the dummy dies 330 each may exclude the conductive pillars 330d and the protection layer 330e. In other words, the conductive pillars 330d and the protection layer 330e may be omitted. For example, the dummy dies 330 each may include the pads 330b distributed on the active surface 330a of the semiconductor substrate 330s and the passivation layer 330c covering the active surface 330a and a portion of the pad 330b. The disclosure is not limited thereto.

In some embodiments, the numbers of the pads 130b, the conductive pillars 130d, the pads 330b, and the conductive pillars 330d are not limited to the disclosure, and may be selected based on the design layout and the demand.

In some embodiments, the semiconductor die 130 and the dummy dies 330 are arranged on a X-Y plane in a random arrangement or an array arrangement, where the semiconductor die 130 and the dummy dies 330 are individually spaced apart from one another. That in, for example, the semiconductor die 130 and the dummy dies 330 are not overlapped in the stacking direction Z, and the positioning locations of the semiconductor die 130 and the dummy dies 330 are not overlapped on the X-Y plane. As shown in FIG. 4 and FIG. 13A, the semiconductor die 130 is surrounded by the dummy dies 330, where the dummy dies each respectively located on the corners of the positioning area of the redistribution circuit structure 118 for achieving the package warpage control. In addition, due to the material of the dummy dies 330, the dummy dies 330 further serve as heat dissipating elements for the package structure PS1.

Figure 13D:
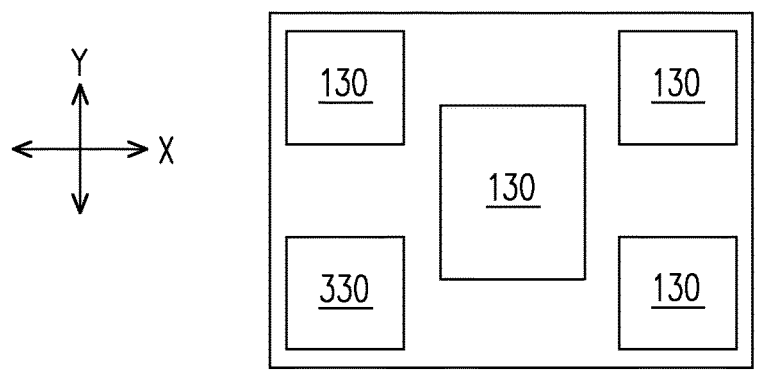
Figure 13E:
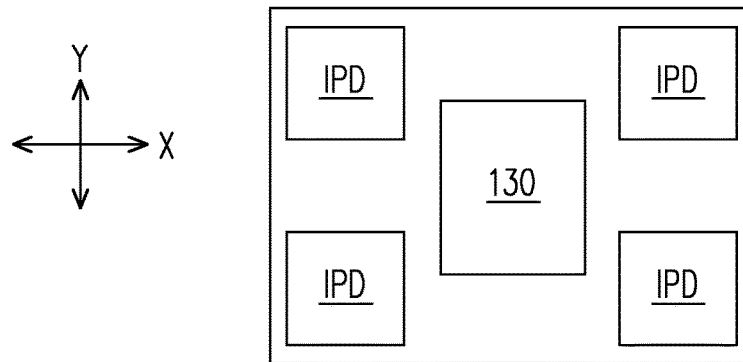
Figure 13F:
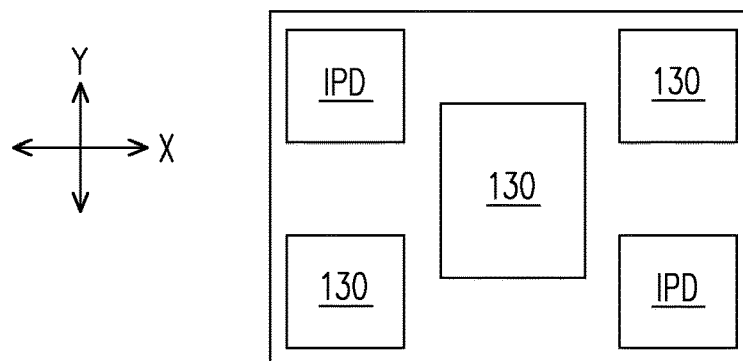
Figure 13G:
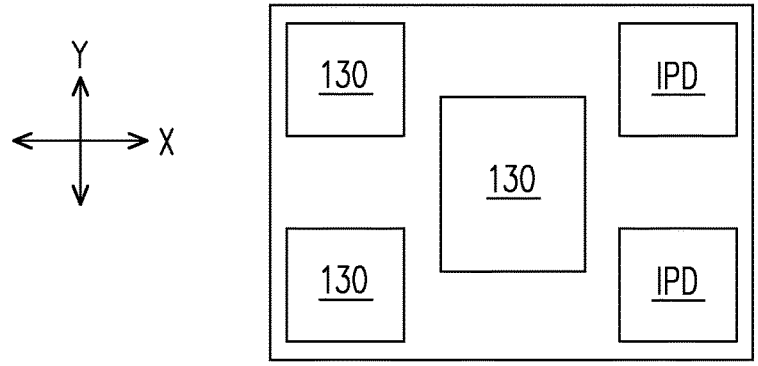
Figure 13H:
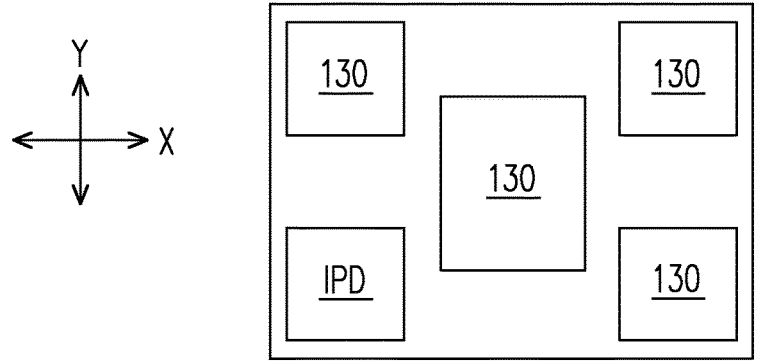
Figure 13I:
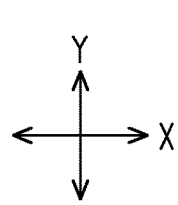
Figure 13I:
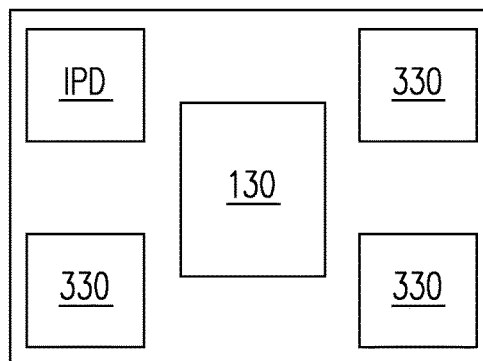
Figure 13J:
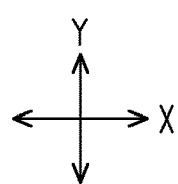
Figure 13J:
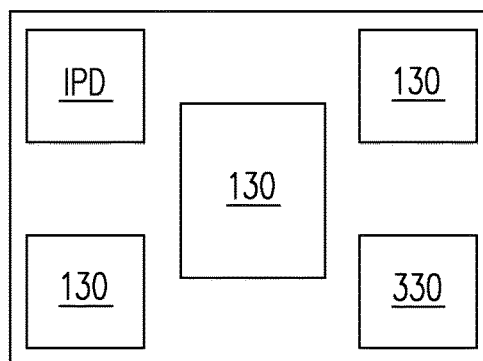
Figure 13K:
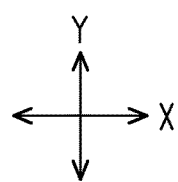
Figure 13K:
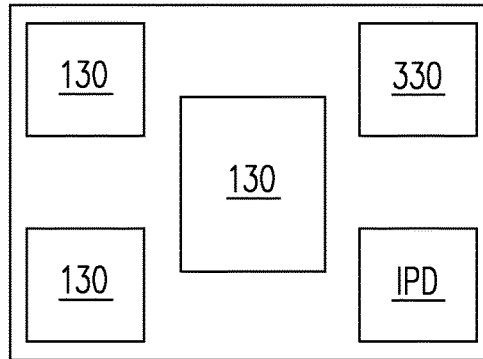
Figure 13L:
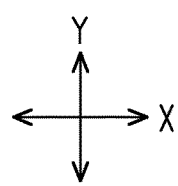
Figure 13L:
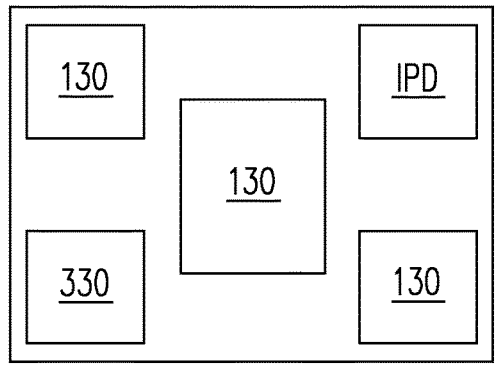

However, the disclosure is not limited thereto. In some embodiments, some of the dummy dies 330 depicted in FIG. 13A may be replaced with the semiconductor die 130. That is, in certain embodiments, only the semiconductor die(s) 130 and the dummy dies 130 are simultaneously disposed on the redistribution circuit structure 118. For example, there may be three semiconductor dies 130 along with two dummy dies 330 (FIG. 13B and FIG. 13C) or four semiconductor dies 130 along with one dummy dies 330 (FIG. 13D).

Continued on FIG. 4, for example, the through vias 120 are located aside of a positioning location of the semiconductor die 130 and positioning locations of the dummy dies 330, and are mechanically and electrically connected to the metallization layer 118b of the redistribution circuit structure 118. In FIG. 4, a height of the through vias 120 is greater than a height of the semiconductor die 130, for example; however, the disclosure is not limited thereto. In an alternative embodiment, the height of the through vias 120 may be less than or substantially equal to the height of the semiconductor die 130.

The disclosure is not limited thereto. In some embodiments, the formation of the through vias 120 illustrated in FIG. 3 may be performed after disposing the semiconductor die 130 and the dummy dies 330 (and/or the integrated passive devices IPD) illustrated in FIG. 4.

Figure 5:
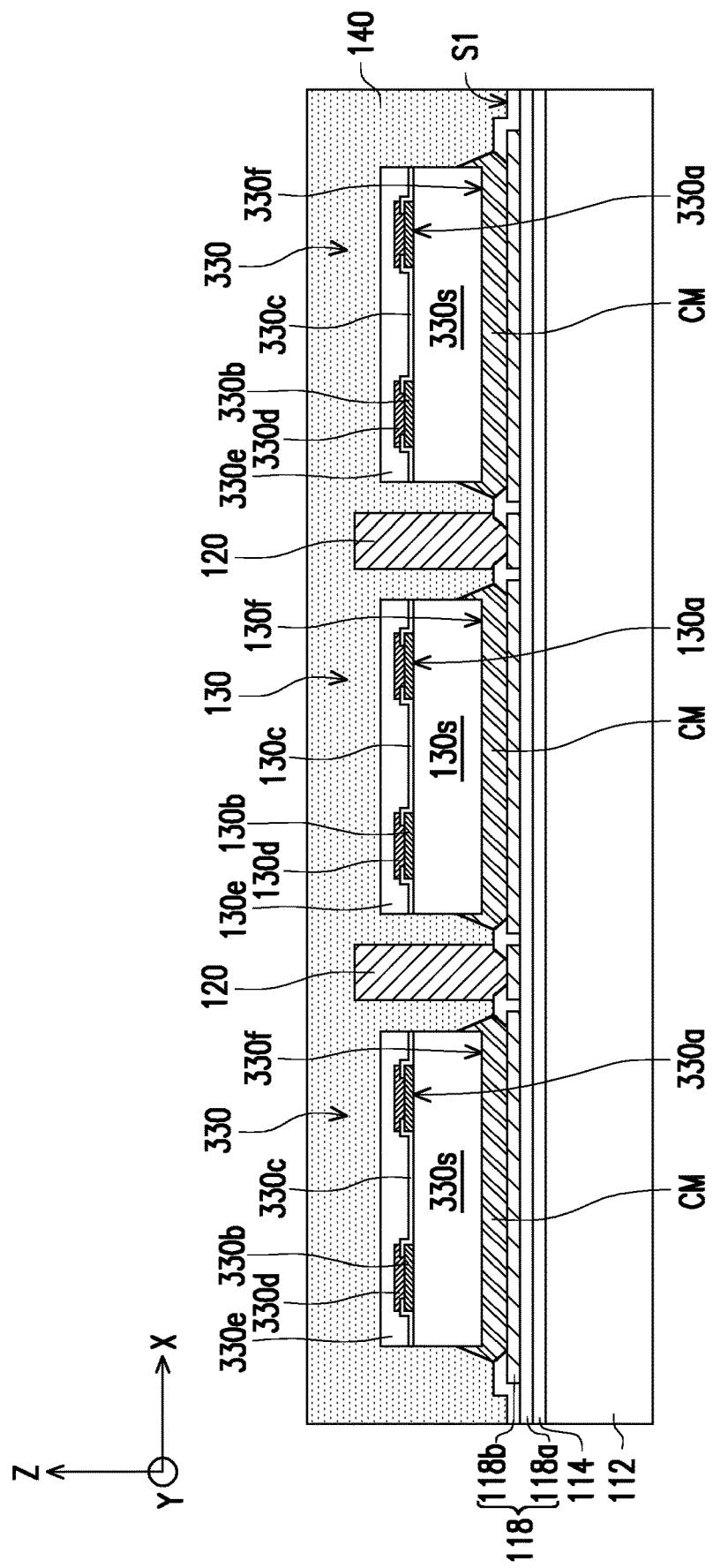

Referring to FIG. 5, in some embodiments, the through vias 120, the semiconductor die 130, and the dummy dies 330 are encapsulated in an insulating encapsulation 140. In some embodiments, the insulating encapsulation 140 is formed on the redistribution circuit structure 118 and over the carrier 112. As shown in FIG. 5, the insulating encapsulation 140 at least fills up the gaps between the through vias 120, between the through vias 120, the semiconductor die 130 and the connecting material CM, between the through vias 120, the dummy dies 330 and the connecting material CM, and between the dummy dies 330 and the connecting material CM. In some embodiments, the insulating encapsulation 140 covers the redistribution circuit structure 118, the semiconductor die 130, and the dummy dies 330. In certain embodiments, as shown in FIG. 5, the through vias 120, the semiconductor die 130, and the dummy dies 330 are not accessibly revealed by the insulating encapsulation 140.

In some embodiments, the insulating encapsulation 140 covers the redistribution circuit structure 118 exposed from the through vias 120, the dummy dies 330, the semiconductor die 130, and the connecting material CM. In some embodiments, the insulating encapsulation 140 is a molding compound formed by a molding process. In some embodiments, the insulating encapsulation 140, for example, may include polymers (such as epoxy resins, phenolic resins, silicon-containing resins, or other suitable resins), dielectric materials, or other suitable materials. In an alternative embodiment, the insulating encapsulation 140 may include an acceptable insulating encapsulation material. In some embodiments, the insulating encapsulation 140 may further include inorganic filler or inorganic compound (e.g. silica, clay, and so on) which can be added therein to optimize coefficient of thermal expansion (CTE) of the insulating encapsulation 140. The disclosure is not limited thereto.

Figure 6:
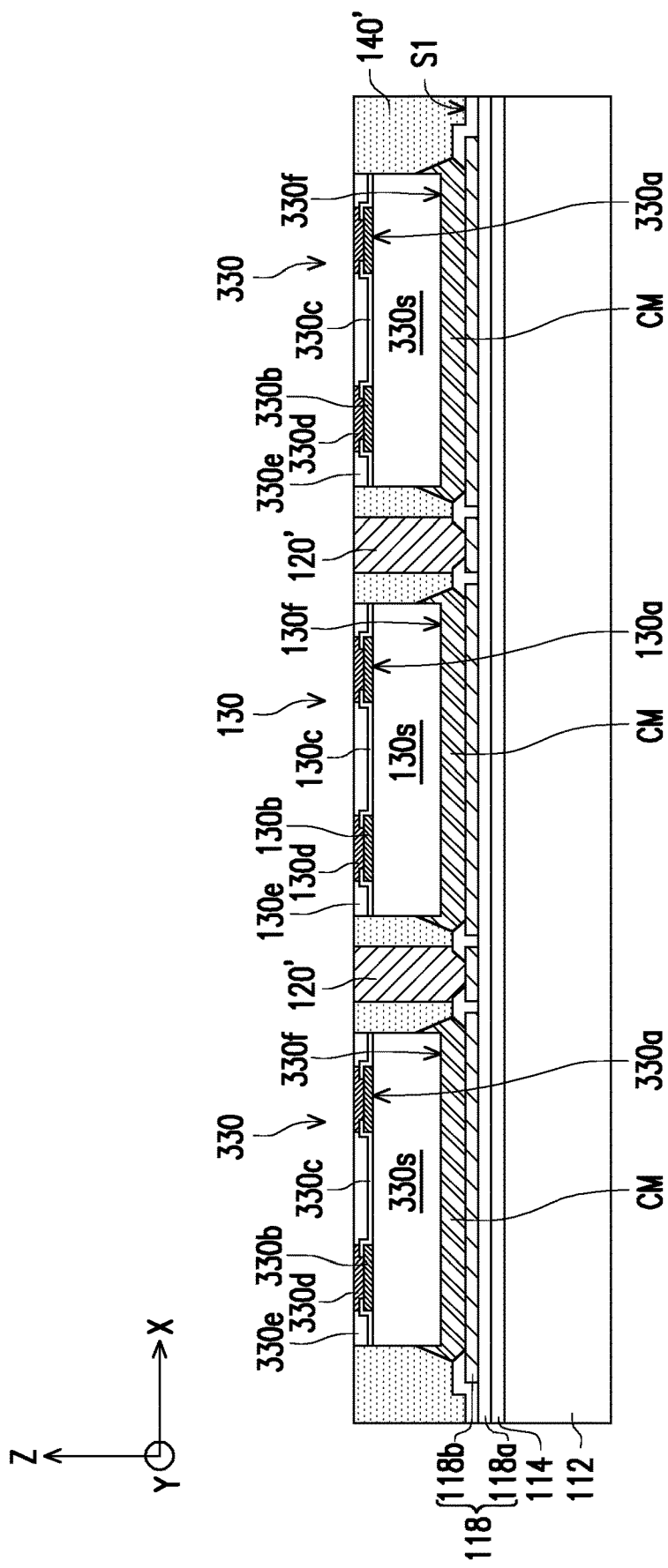

Referring to FIG. 6, in some embodiments, the insulating encapsulation 140 is planarized to form an insulating encapsulation 140' exposing the through vias 120, the semiconductor die 130, and the dummy dies 330. In certain embodiments, as shown in FIG. 6, after the planarization, top surfaces 120a of the through vias 120, top surfaces of the conductive pillars 130d and the protection layer 130e (of the semiconductor die 130), and top surfaces of the conductive pillars 330d and the protection layer 330e (of the dummy dies 330) are exposed by a top surface 140a' of the insulating encapsulation 140'. That is, for example, the top surfaces of the conductive pillars 130d and the protection layer 130e of the semiconductor die 130, the top surfaces of the conductive pillars 330d and the protection layer 330e of the dummy dies 330, and the top surfaces 120a of the through vias 120 become substantially leveled with the top surface 140a' of the insulating encapsulation 140'. In other words, the top surfaces of the conductive pillars 130d and the protection layer 130e of the semiconductor die 130, the top surfaces of the conductive pillars 330d and the protection layer 330e of the dummy dies 330, the top surfaces 120a of the through vias 120, and the top surface 140a' of the insulating encapsulation 140' are substantially coplanar to each other.

The insulating encapsulation 140 may be planarized by mechanical grinding or chemical mechanical polishing (CMP), for example. After the planarizing step, a cleaning step may be optionally performed, for example to clean and remove the residue generated from the planarizing step. However, the disclosure is not limited thereto, and the planarizing step may be performed through any other suitable method.

In some embodiments, during planarizing the insulating encapsulation 140, the conductive pillars 130d and the protection layer 130e of the semiconductor die 130, the conductive pillars 330d and the protection layer 330e of the dummy dies 330, and the through vias 120 may also be planarized. In certain embodiments, the planarizing step may, for example, performed on the over-molded insulating encapsulation 140 to level the top surface 140a' of the insulating encapsulation 140', the top surfaces 120a of the through vias 120, the top surfaces of the conductive pillars 130d and the protection layer 130e of the semiconductor die 130, and the top surfaces of the conductive pillars 330d and the protection layer 330e of the dummy dies 330.

Figure 7:
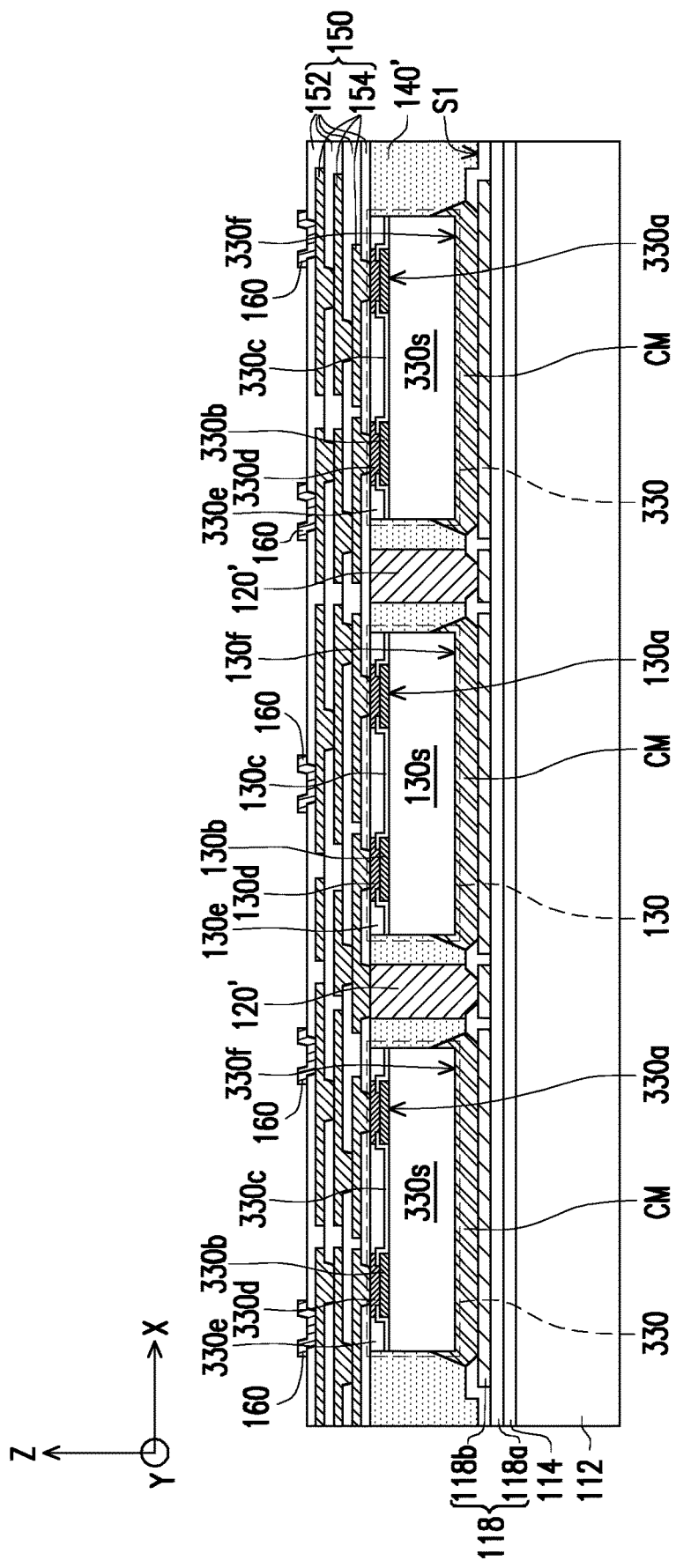

Referring to FIG. 7, in some embodiments, a redistribution circuit structure 150 is formed on the through vias 120, the semiconductor die 130, the dummy dies 330 and the insulating encapsulation 140'. As shown in FIG. 7, the redistribution circuit structure 150 is formed on the top surfaces 120a of the through vias 120, the top surfaces of the conductive pillars 130d and the protection layer 130e of the semiconductor die 130, the top surfaces of the conductive pillars 330d and the protection layer 330e of the dummy dies 330, and the top surface 140a' of the insulating encapsulation 140'. In some embodiments, the redistribution circuit structure 150 is electrically connected to the through vias 120, is electrically connected to the semiconductor die 130 through the conductive pillars 130d, and is electrically connected to the dummy dies 330 through the conductive pillars 330d. In some embodiments, through the redistribution circuit structure 150, the semiconductor die 130 is electrically connected to the through vias 120. In some embodiments, through the redistribution circuit structure 150, the dummy dies 330 are electrically connected to the through vias 120. In some embodiments, through the redistribution circuit structure 150, the semiconductor die 130 is electrically connected to the dummy dies 330. In some embodiments, through the redistribution circuit structure 150 and the through vias 120, the semiconductor die 130 is electrically connected to the redistribution circuit structure 118. In some embodiments, through the redistribution circuit structure 150 and the through vias 120, the dummy dies 330 are electrically connected to the redistribution circuit structure 118. As shown in FIG. 7, for example, the redistribution circuit structure 150 is referred to as a front-side redistribution layer of the semiconductor die 130.

In some embodiments, as shown in FIG. 7, along a stacking direction (e.g. a direction Z depicted in FIG. 7), the semiconductor die 130 and the dummy dies 330 are directly located between the redistribution circuit structure 150 and the connecting material CM, where the through vias 120 and the insulating encapsulation 140' are directly located between the redistribution circuit structure 150 and the redistribution circuit structure 118.

In some embodiments, the formation of the redistribution circuit structure 150 includes sequentially forming one or more dielectric layers 152 and one or more metallization layers 154 in alternation. In certain embodiments, as shown in FIG. 7, the metallization layers 154 are sandwiched between the dielectric layers 152, where the top surface of a topmost layer of the metallization layers 154 is exposed by a topmost layer of the dielectric layers 152 and the bottom surface of a lowest layer of the metallization layers 154 is exposed by a lowest layer of the dielectric layers 152 to electrically connect the through vias 120 and the conductive pillars 130d of the semiconductor die 130, to electrically connect the through vias 120 and the conductive pillars 330d of each of the dummy dies 330, and/or to electrically connect the semiconductor die 130 and the dummy dies 330.

In some embodiments, the formation of the dielectric layers 152 may be the same as the formation of the dielectric layers 118a, and the formation of the metallization layers 154 may be the same as the formation of the metallization layer 118b, thus is not repeated herein. In an alternative embodiment, the material of the dielectric layers 152 may be the same as or different from the material of the dielectric layers 118a. In an alternative embodiment, the material of the metallization layers 154 may be the same as or different from the material of the metallization layer 118b. The disclosure is not limited thereto. It should be noted that the redistribution circuit structure 150 is not limited to include three dielectric layers and/or two metallization layers. For example, the numbers of the metallization layers and the dielectric layers may be one or more than one. As shown in FIG. 7, in some embodiments, the redistribution circuit structure 118, the through vias 120, and the redistribution circuit structure 150 provide a routing function for the semiconductor die 130. In addition, the dummy dies 330 are electrically coupled to the semiconductor die 130 through the redistribution circuit structure 150.

Continued on FIG. 7, in some embodiments, a plurality of under-ball metallurgy (UBM) patterns 160 may be disposed on the exposed top surfaces of the topmost layer of the metallization layers 154 for electrically connecting with conductive elements (e.g. conductive balls or conductive bumps). As shown in FIG. 7, for example, the UBM patterns 160 are formed on and electrically connected to the redistribution circuit structure 150. The materials of the UBM patterns 160 may include copper, nickel, titanium, tungsten, or alloys thereof or the like, and may be formed by an electroplating process, for example. The number of the UBM patterns 160 is not limited in this disclosure, and corresponds to the number of portions of the top surface of the topmost layer of the metallization layers 154 exposed by the topmost layer of the dielectric layers 152.

Figure 8:
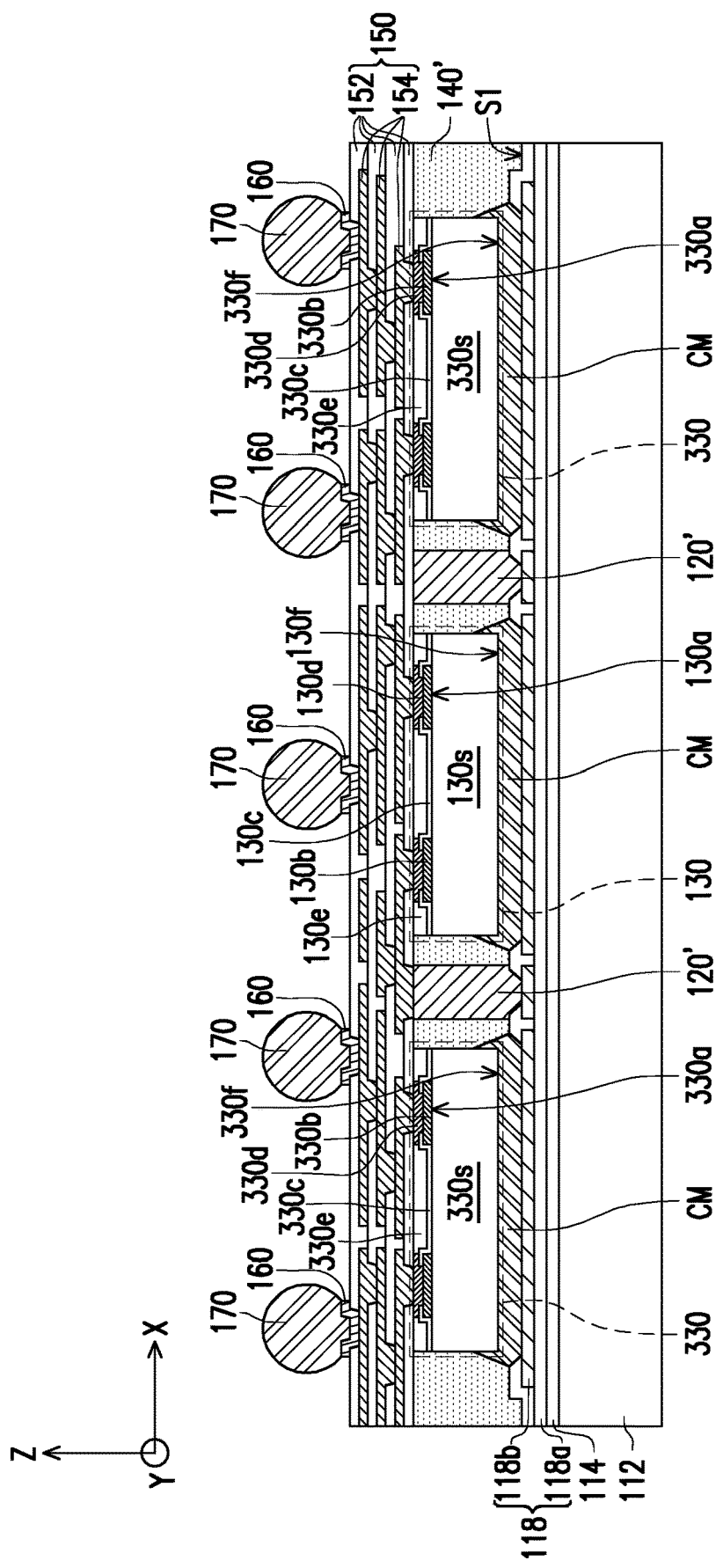

Referring to FIG. 8, in some embodiments, after the redistribution circuit structure 150 is formed, a plurality of conductive elements 170 are formed over the semiconductor die 130 and the dummy dies 330. As shown in FIG. 8, the conductive elements 170 are disposed on the UBM patterns 160 over the redistribution circuit structure 150, for example. In some embodiments, the conductive elements 170 may be disposed on the UBM patterns 160 by ball placement process or reflow process. In some embodiments, the conductive elements 170 are, for example, solder balls or ball grid array (BGA) balls. The number of the conductive elements 170 is not limited to the disclosure, and may be designated and selected based on the number of the UBM patterns 160.

In some embodiments, the conductive elements 170 are connected to the redistribution circuit structure 150 through the UBM patterns 160. In some embodiments, some of the conductive elements 170 are electrically connected to the semiconductor die 130 through the UBM patterns 160 and the redistribution circuit structure 150. In some embodiments, some of the conductive elements 170 are electrically connected to the dummy dies 330 through the UBM patterns 160 and the redistribution circuit structure 150. In some embodiments, some of the conductive elements 170 are electrically connected to the through vias 120 through the UBM patterns 160 and the redistribution circuit structure 150. In some embodiments, some of the conductive elements 170 are electrically connected to the redistribution circuit structure 118 through the UBM patterns 160, the redistribution circuit structure 150 and the through vias 120.

However, the disclosure is not limited thereto. In some alternative embodiments, the UBM patterns 160 may be omitted. For example, the conductive elements 170 may directly connected to the redistribution circuit structure 150.

Figure 9:
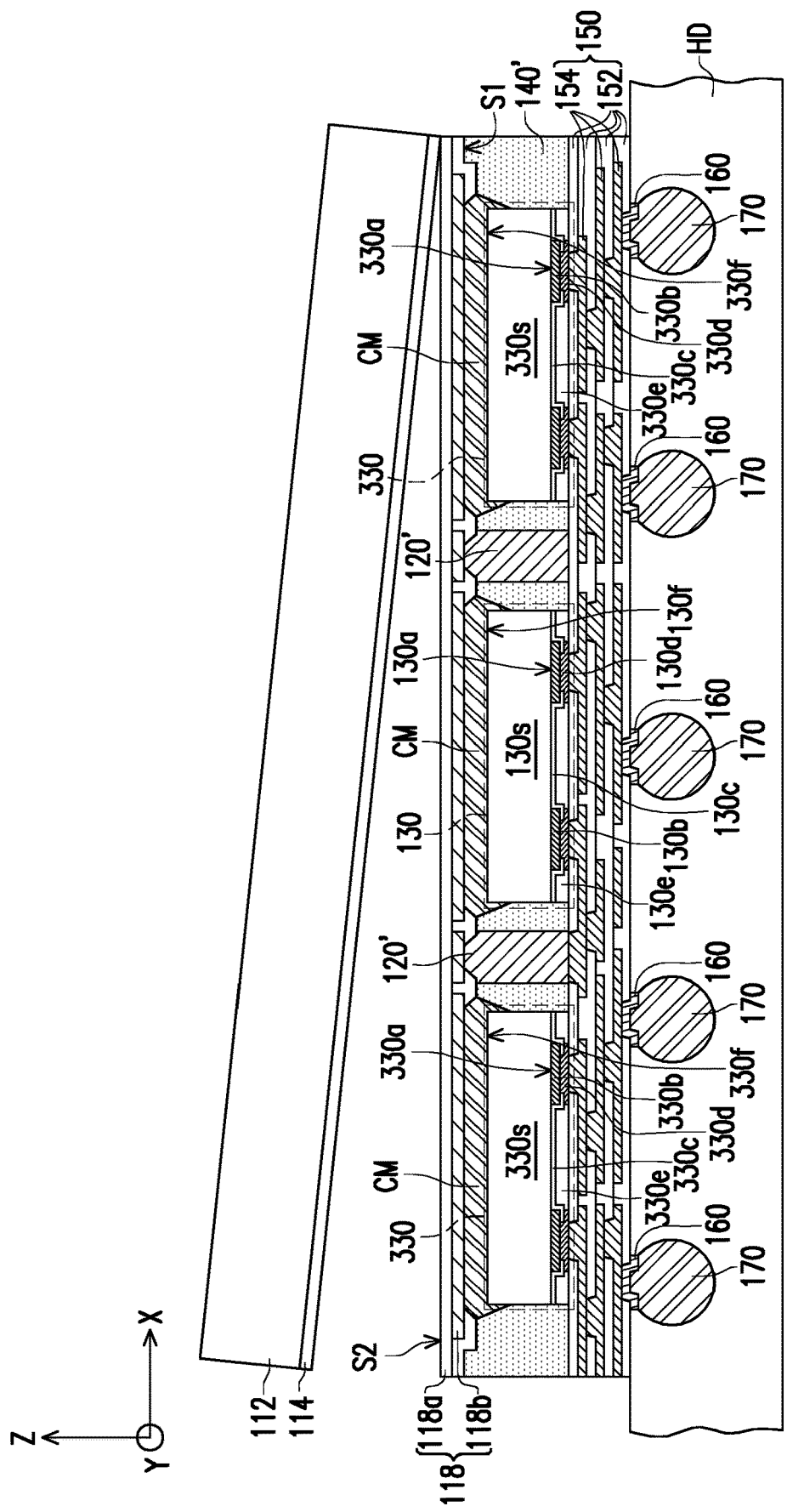

Referring to FIG. 9, in some embodiments, the whole first package 10 along with the carrier 112 is flipped (turned upside down), where the conductive elements 170 are placed to a holding device HD, and the carrier 112 is then debonded from the redistribution circuit structure 118. In some embodiments, the holding device HD includes a polymer film, and the conductive elements 170 are mounted into the polymer film as shown in FIG. 9. For example, the material of the polymer film may include a polymer film having sufficient elasticity to allow the conductive elements 170 being embedded therein. In certain embodiments, the holding device HD may be a parafilm or a film made of other suitable soft polymer materials or the like. In an alternative embodiment, the holding device HD may be an adhesive tape, a carrier film or a suction pad. The disclosure is not limited thereto.

In some embodiments, the redistribution circuit structure 118 is easily separated from the carrier 112 due to the debond layer 114. In some embodiments, the carrier 112 is detached from the redistribution circuit structure 118 through a debonding process, and the carrier 112 and the debond layer 114 are removed. In certain embodiments, a second side S2 of the redistribution circuit structure 118 is exposed, as show in FIG. 9. In one embodiment, the debonding process is a laser debonding process. During the debonding step, the holding device HD is used to secure the package structures 10 before debonding the carrier 112 and the debond layer 114.

In some embodiments, prior to flipping the first package 10 depicted in FIG. 8 and debonding the carrier CR therefrom, a pre-cutting step is performed to the first package 10. For example, the pre-cutting step cut through at least the redistribution circuit structure 150, the insulating encapsulation 140', and the redistribution circuit structure 118 of the first package 10. The pre-cutting step may, for example, include laser cut, or the like. Due to the pre-cutting step, the package structures 10 interconnected therebetween are partially diced; and due to the debonding step, the partially diced package structures 10 are entirely separated from one another.

Continued on FIG. 9, in some embodiments, the redistribution circuit structure 118 exposed from the debonding step is patterned to expose portions of the metallization layer 118b. In some embodiments, the bottommost layer (depicted in FIG. 8) of the dielectric layers 118a is patterned to form a plurality of openings (not labelled) respectively exposing portions of a surface of the metallization layer 118b. The patterning step may, for example, include a laser drilling process; however, the disclosure is not limited thereto. The number of the openings formed in the bottommost layer (depicted in FIG. 8) of the dielectric layers 118a is not limited thereto, and may be designated and selected based on the demand.

Figure 10:
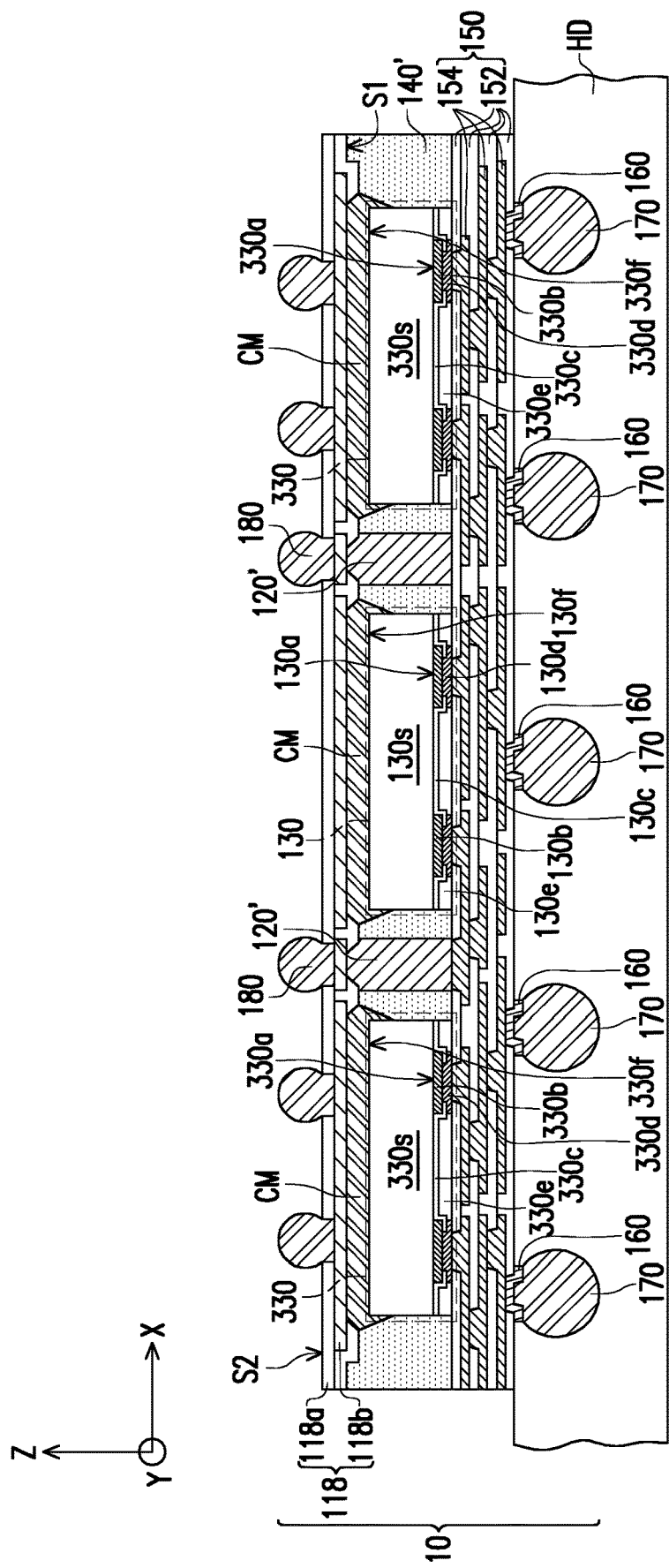

Referring to FIG. 10, in some embodiments, after the formation of the openings, pre-solders 180 are formed on the exposed surface of the metallization layer 118b exposed by the openings formed in the bottommost layer (depicted in FIG. 8) of the dielectric layers 118a. As shown in FIG. 10, the pre-solders 180 are electrically connected to the semiconductor die 130 through the redistribution circuit structure 118, the conductive pillars 120, and the redistribution circuit structure 150, in some embodiments. In some embodiments, through the redistribution circuit structure 118, the conductive pillars 120, the redistribution circuit structure 150, and the UBM patterns 162, the conductive elements 170 are electrically connected to the per-solders 180. In some embodiments, through the redistribution circuit structure 118, the conductive pillars 120, and the redistribution circuit structure 150, the dummy dies 330 are electrically connected to the per-solders 180. In certain embodiments, the pre-solders 180 are pre-solder pastes, for example. In an alternative embodiment, the pre-solders 180 may be pre-solder blocks. In some embodiments, the material of the pre-solders 180 may include a lead-free solder material (such as Sn—Ag base or Sn—Ag—Cu base materials) with or without additional impurity (such as Ni, Bi, Sb, Au, or the like). The disclosure is not limited thereto. In the disclosure, the pre-solders 180 may be referred to as conductive connectors for connecting to another package. Up to here, the first package 10 is manufactured.

As shown in FIG. 10, for example, due to the dummy dies 330 are electrically connected to the semiconductor die 130 through the pads 130b and the pads 330b, the MOS capacitor included in each of the dummy dies 330 electrically connected to the pads 330b is electrically coupled to the semiconductor die 130. In the disclosure, the MOS capacitor included in each of the dummy dies 330 provides a capacitance adaptive control for the semiconductor die 130. That is, the capacitance of the MOS capacitor included in each of the dummy dies 330 is controllable in accordance with the semiconductor die 130 for adjusting/tuning the power input to the semiconductor die 130 to suppress the signal and power noises. Consequently, the signal integrity and the power integrity of the semiconductor die 130 is improved, and thereby enhancing performance efficiency thereof. Owing to the dummy dies 330 having the MOS capacitors electrically connected to the semiconductor die 130, additional, external integrated passive devices (IPDs; e.g. capacitors) conventionally bonded to an outer side of a package and electrically connected thereto can be omitted, thereby increasing the number of the conductive elements 170 and reducing the manufacturing cost. That is, a number of the input/output terminals (e.g. the conductive elements 170) of power/ground/signal transmitting to and/or transmitting from the package structures PS1 is increased.

In alternative embodiments, in the first package 10 of the package structure PS1, all of the dummy dies 330 may be replaced by integrated passive devices IPD each having at least one capacitor therein, such as the dummy dies 130 depicted in FIG. 13A to FIG. 13D are all replaced with the integrated passive devices IPD, which are shown respectively in FIG. 13E to FIG. 13H. That is, in certain embodiments, only the semiconductor die(s) 130 and the integrated passive device(s) IPD are simultaneously disposed on the redistribution circuit structure 118. In the disclosure, the integrated passive devices IPD serve as decoupling capacitors to the semiconductor die 130, which also improves the signal integrity and power integrity of the semiconductor die 130, and thereby the performance efficiency of the package structure PS1 is enhanced. Furthermore, due to the integrated passive devices IPD serving as decoupling capacitors are located in the insulating encapsulation 140' and arranged aside of the semiconductor die 130 on the X-Y plane, the additional, external integrated passive devices conventionally bonded to an outer side of a package and electrically connected thereto can be omitted, thereby increasing the number of the conductive elements 170 and reducing the manufacturing cost. Besides, as the integrated passive devices IPD involve a silicon-based material as a substrate, the integrated passive devices IPD further serve as part of the heat dissipating elements; while the positioning configuration of the integrated passive devices IPD further provides warpage control.

In further alternative embodiments, in the first package 10 of the package structure PS1, some of the dummy dies 330 and/or some of the semiconductor dies 130 may be replaced by the integrated passive devices IPD each having at least one capacitor therein, such as the dummy dies 130 depicted in FIG. 13A to FIG. 13D are partially replaced by the integrated passive devices IPD, which are shown respectively in FIG. 13I to FIG. 13L. That is, in certain embodiments, at least one the semiconductor die 130, at least one dummy die 330, and at least one integrated passive device IPD are simultaneously disposed on the redistribution circuit structure 118.

In some embodiments, a set of two MOS capacitors, a set of two integrated passive devices IPD, or a set of one MOS capacitor and one integrated passive device IPD is electrically connected in series by a portion of the metallization layer 154 of the redistribution circuit structure 150, where such set serves as a filter (also known as a pi ($\pi$) filter) to suppress the signal and power noise, and thereby enhancing the signal integrity and power integrity of the semiconductor die 130. Consequently, the performance efficiency of the package structure PS1 is enhanced.

Additional dummy dies 330, integrated passive devices IPD, and/or semiconductor dies 130 may further be included in the first package 10 of the package structure PS1. For example, the dummy dies 330, integrated passive devices IPD, and/or semiconductor dies 130 may be arranged between two dummy dies 130 along the edges of the positioning area of the redistribution circuit structure 118, and/or arranged at any available location aside of the existing dummy dies 330, integrated passive devices IPD, and/or semiconductor dies 130.

Figure 11:
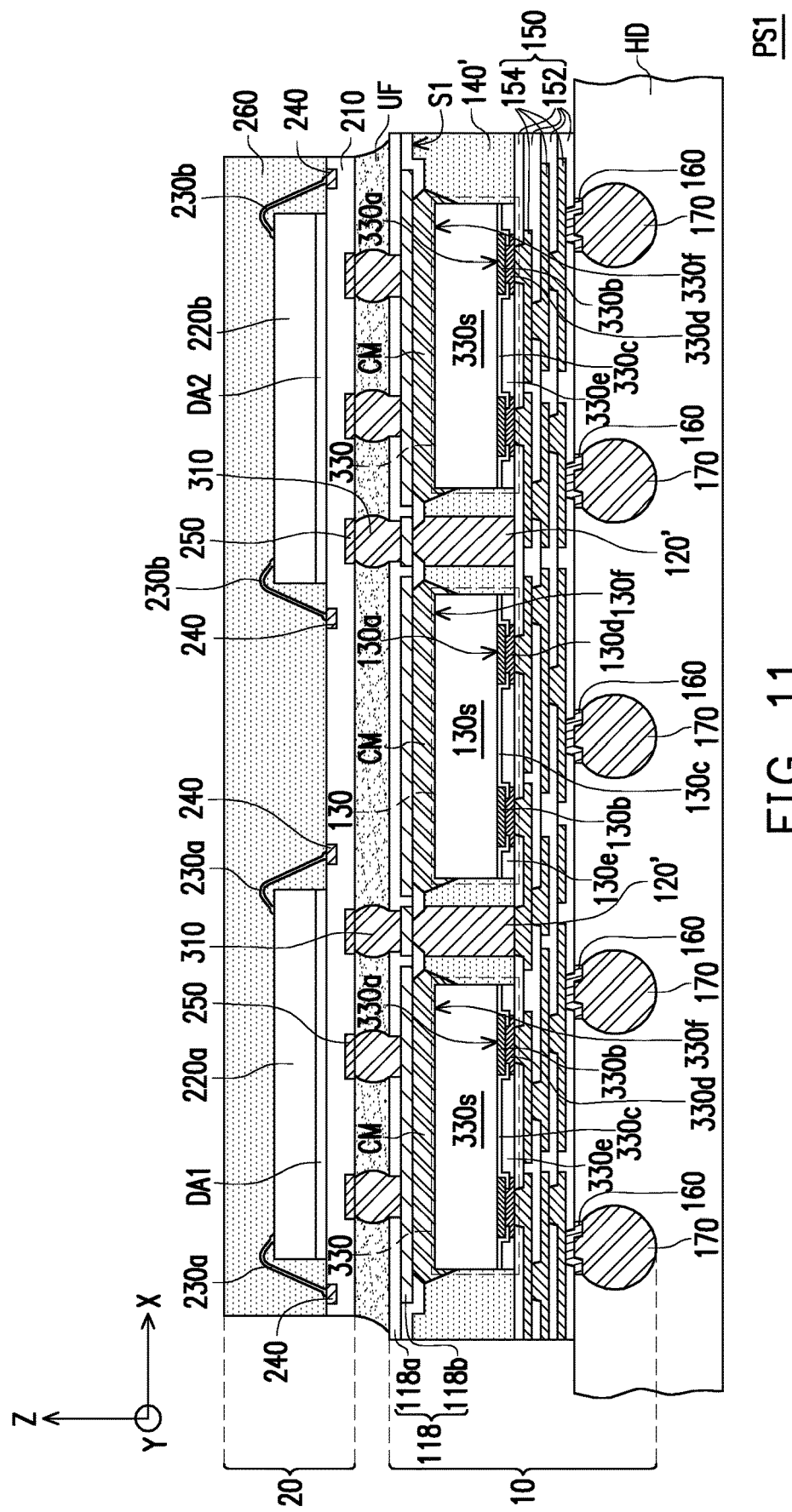

Referring to FIG. 11, in some embodiments, a second package 20 is provided and bonded to the first package 10 to form the package structure PS1. In some embodiments, the second package 20 has a substrate 210, semiconductor dies 220a and 220b, bonding wires 230a and 230b, conductive pads 240, conductive pads 250, an insulating encapsulation 260, and the joining solder balls (not shown). As shown in FIG. 11, for example, the semiconductor die 220a with a connecting film DA1 disposed thereon and the semiconductor die 220b with a connecting film DA2 are provided and are disposed on the substrate 210 through the connecting film DA1 and the connecting film DA2, respectively. In some embodiments, the connecting film DA1 and the connecting film DA2 are respectively located between the semiconductor die 220a and the substrate 210 and between the semiconductor die 220b and the substrate 210. In other words, the connecting film DA1 and the connecting film DA2 physically contact backside surfaces of the semiconductor dies 220a and 220b with a surface of the substrate 210. In some embodiments, due to the connecting films D1 and DA2 provided between the semiconductor dies 220a, 220b and the substrate 210, the semiconductor dies 220a, 220b are stably adhered to the substrate 210. In some embodiments, the connecting films D1, DA2 may be, for example, a semiconductor die attach film, a layer made of adhesives or epoxy resin, or the like.

For example, the semiconductor dies 220a and 220b are mounted on one surface (e.g. the top surface depicted in FIG. 11) of the substrate 210. In some embodiments, the semiconductor dies 220*a*, 220*b* may be logic chips (e.g., central processing units, microcontrollers, etc.), memory chips (e.g., dynamic random access memory (DRAM) chips, static random access memory (SRAM) chips, etc.), power management chips (e.g., power management integrated circuit (PMIC) chips), radio frequency (RF) chips, sensor chips, signal processing chips (e.g., digital signal processing (DSP) chips), front-end chips (e.g., analog front-end (AFE) chips, the like, or a combination thereof). In one embodiment, the semiconductor dies 220*a* and 220*b* may be the same. For example, the semiconductor dies 220*a* and 220*b* may be, for example, DRAM chips. However, the disclosure is not limited thereto; in an alternative embodiment, the semiconductor dies 220*a* and 220*b* may be different from each other.

In some embodiments, the bonding wires 230*a* and 230*b* are respectively used to provide electrical connections between the semiconductor dies 220*a*, 220*b* and the conductive pads 240 (such as bonding pads) located on one surface of the substrate 210.

In some embodiments, the insulating encapsulation 260 is formed to encapsulate the semiconductor dies 220*a*, 220*b*, the bonding wires 230*a*, 230*b*, and the conductive pads 240 to protect these components. In some embodiments, the materials of the insulating encapsulation 260 is the same as the insulating encapsulation 140/140', and thus is not repeated herein. In one embodiment, the materials of the insulating encapsulation 260 is different from the insulating encapsulation 140/140', the disclosure is not limited thereto.

In some embodiments, through insulator vias (not shown) or interconnects (not shown) may be used to provide electrical connection between the conductive pads 240 and the conductive pads 250 (such as bonding pads) that are located on another surface (e.g. a bottom surface depicted in FIG. 11) of the substrate 210. In certain embodiments, the conductive pads 250 are electrically connected to the semiconductor dies 220*a* and 220*b* through these through insulator vias or interconnects (not shown) in addition to the conductive pads 240 and the bonding wires 230*a*, 230*b*.

In some embodiments, the conductive pads 250 of the second package 20 are electrically connected to the redistribution circuit structure 118 of the first package 10 through a plurality of joints 310 that are sandwiched therebetween, where the joints 310 are formed by the joining solder balls (not shown) formed on the conductive pads 250 of the second package 20 and the pre-solder 180 of the first package 10. In certain embodiments, the joints 310 are physically connected to the metallization layer 118*b* of the redistribution circuit structure 118 of the first package 10 and the conductive pads 250 of the second package 20, as shown in FIG. 11. In some embodiments, the first package 10 and the second package 20 are electrically connected and physically connected through the joints 310 sandwiched therebetween. In the disclosure, the joints 310 may be referred to as solder joints for connecting to two packages (e.g. the first package 10 and the second package 20 depicted in FIG. 11).

In addition, as shown in FIG. 11, an underfill UF fills the gaps between the joints 310 and encapsulates the joints 310, for example. In one embodiment, the underfill UF may be formed by underfill dispensing or any other suitable method. In some embodiments, a material of the underfill UF may be the same or different from a material of the planarized insulating encapsulation 140' (or saying the insulating encapsulation 140) and/or a material of the insulating encapsulation 260, the disclosure is not limited thereto. Owing to the underfill UF, a bonding strength between the first package 10 and the second package 20 is enhanced.

Figure 12:
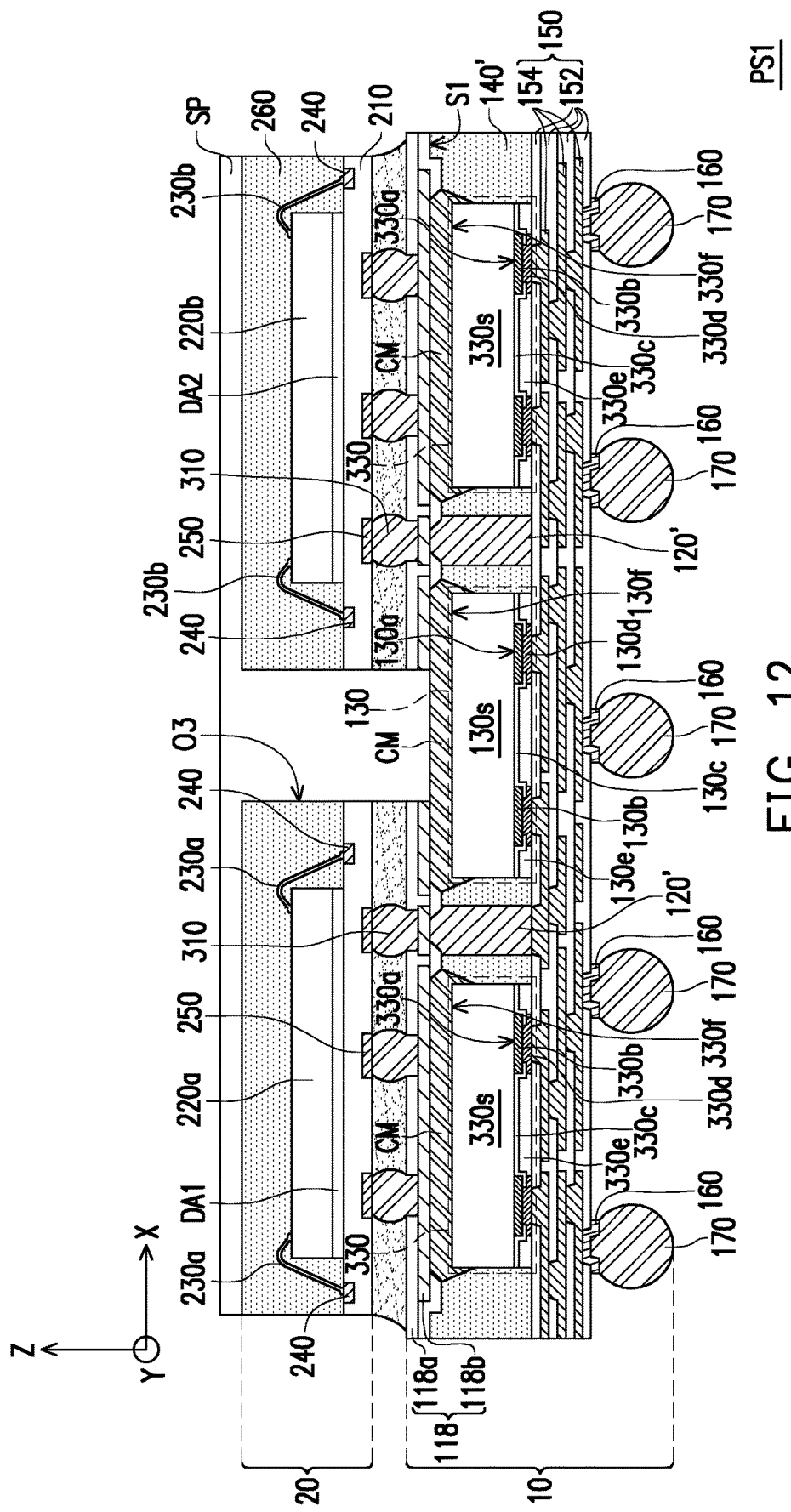

Referring to FIG. 12, in some embodiments, a laser drilling process is performed on the package structure PS1 towards to a side where the second package 20 located at to form at least one opening O3. For example, as shown in FIG. 12, the opening O3 corresponds to the positioning location of the semiconductor die 130, where the connecting material CM adhered to the semiconductor die 130 is exposed by the openings O3. By considering a plane view of the opening O3, the shape of the opening O3 is not limited in the disclosure, and may be a circular shape, an oral shape, a rectangular shape, a square shape, a triangular shape, a polygonal shape, etc. Also, the number of the opening O3 may be one or more than one based on the design layout and the demand.

In some embodiments, a filling material SP is filled into the opening O3 to physically contact with the connecting material CM adhered to the semiconductor die 130. In some embodiments, the filling material SP may be a thermal conductive material or a thermal and electrical conductive material. An example of the filling material SP may be silver paste or solder paste, the disclosure is not limited thereto. Owing to such configuration, the filling material SP can be used as part of the thermal path of heat dissipation for the active die/chip (e.g. the semiconductor die 130) included the package structure PS1. As shown in FIG. 12, for example, the filling material SP further extends on to the insulating encapsulation 260 to cover a top surface of the insulating encapsulation 260. In other words, the filling material SP overlaps with the semiconductor dies 220*a*, 220*b*, 130 and the dummy dies 330. That is, owing to the filling material SP, the thermal dissipation of the package structure PS1 can be further enhanced.

Continued on FIG. 12, in some embodiments, the conductive elements 170 are released from the holding device HD to form the package structure PS1. In some embodiments, if need, a dicing process may be performed to cut a plurality of the package structures PS1 interconnected therebetween into individual and separated package structures PS1 before releasing the conductive elements 170 from the holding device HD. In one embodiment, the dicing process is a wafer dicing process including mechanical blade sawing or laser cutting. Up to here, the manufacture of the package structure PS1 is completed. The package structure PS1 depicted in FIG. 12 may be referred to as a package-on package (PoP) structure.

However, the disclosure is not limited thereto. In some alternative embodiments, the package structure PS1 may be further mounted with an additional package, chips/dies or other electronic devices to form a stacked package structure through the conductive elements 170 and/or other additional connectors based on the design layout and the demand.

Figure 14:
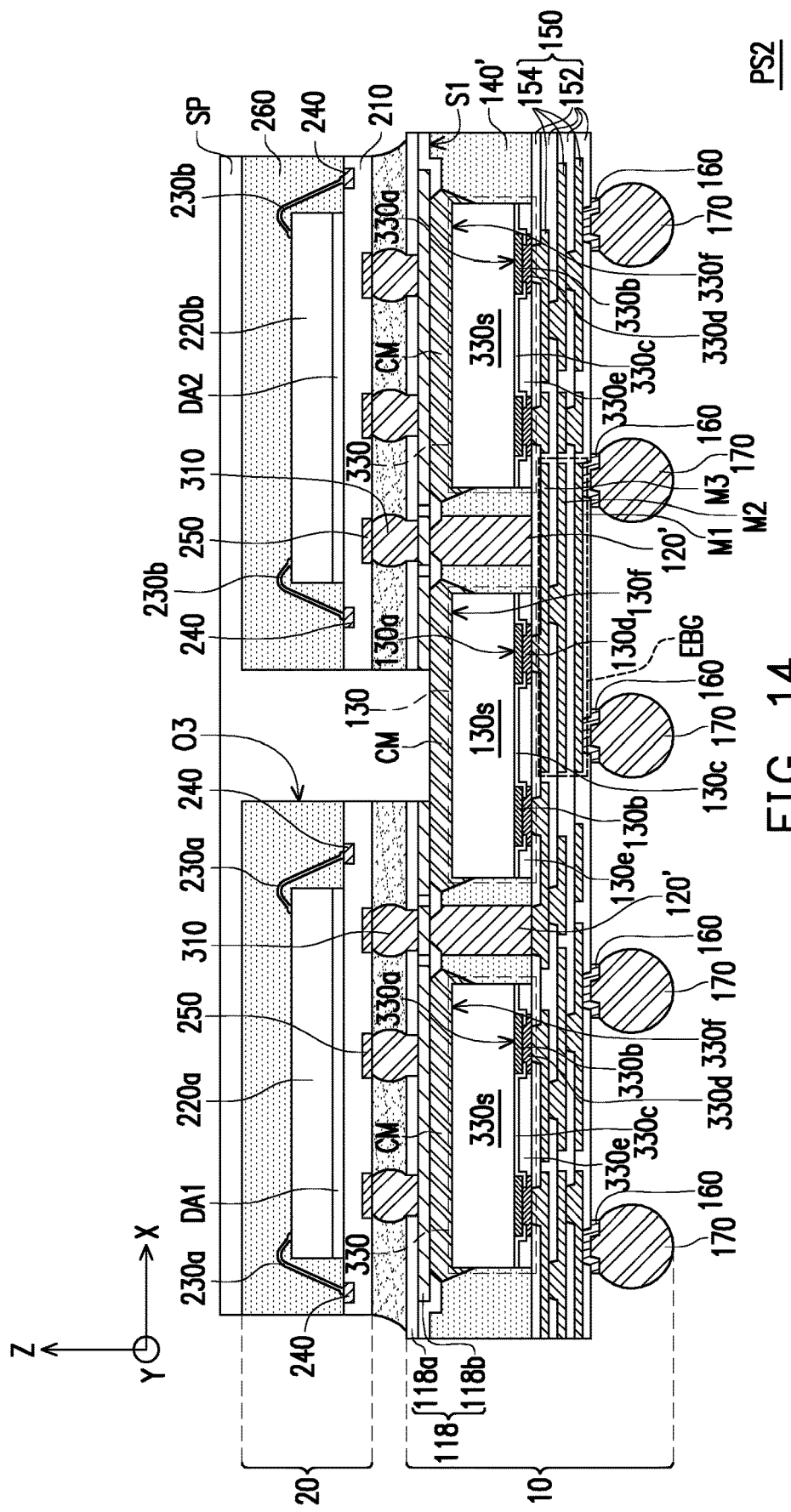
FIG. 14 is a schematic cross-sectional view of a package structure according to some embodiments of the disclosure.
Figure 15A:
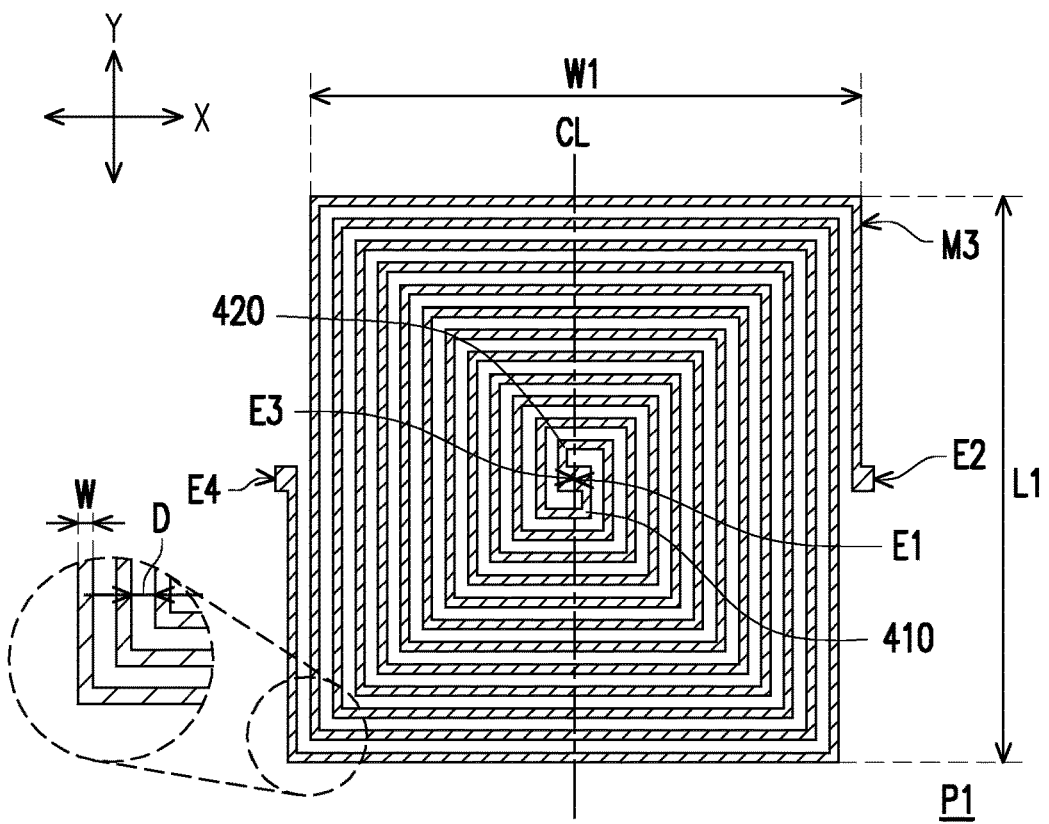
FIG. 15A and FIG. 15B are schematic plane views of various modifications of a spiral pattern structure in a package structure according to some embodiments of the disclosure.
Figure 15B:
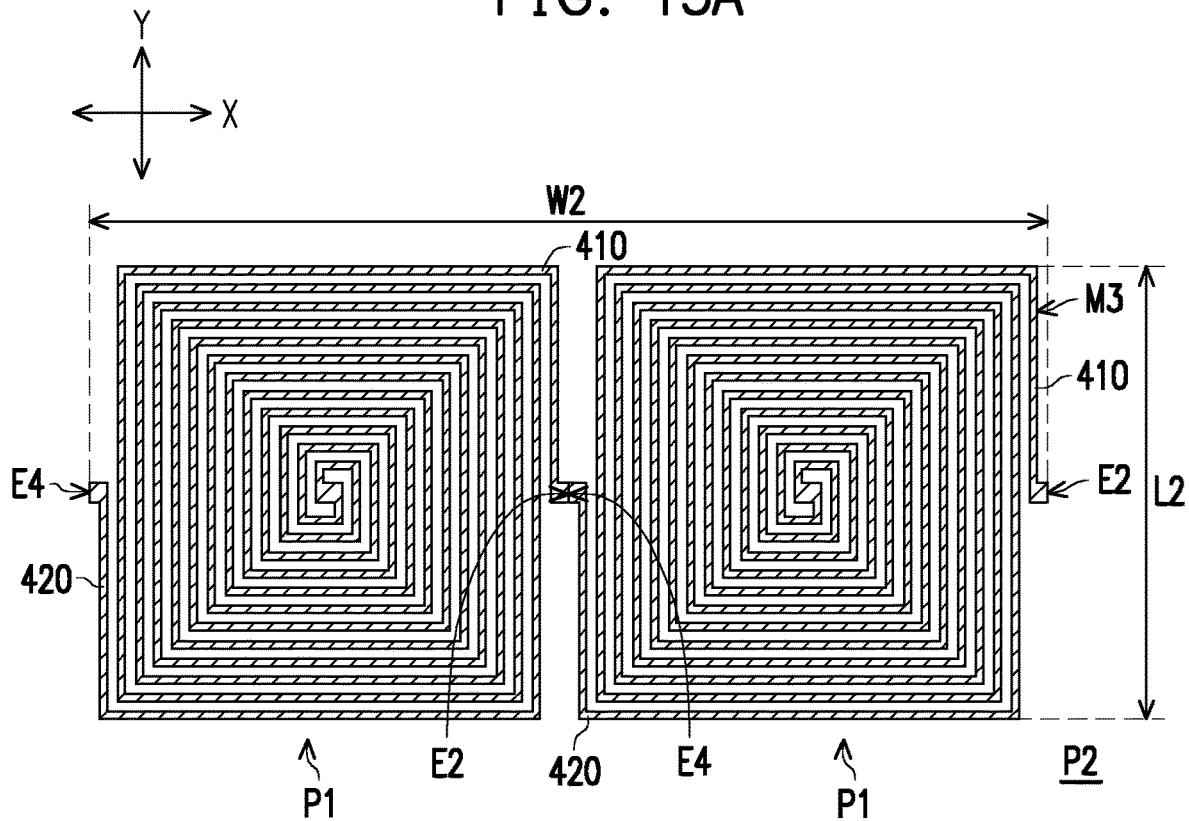
Figure 16:
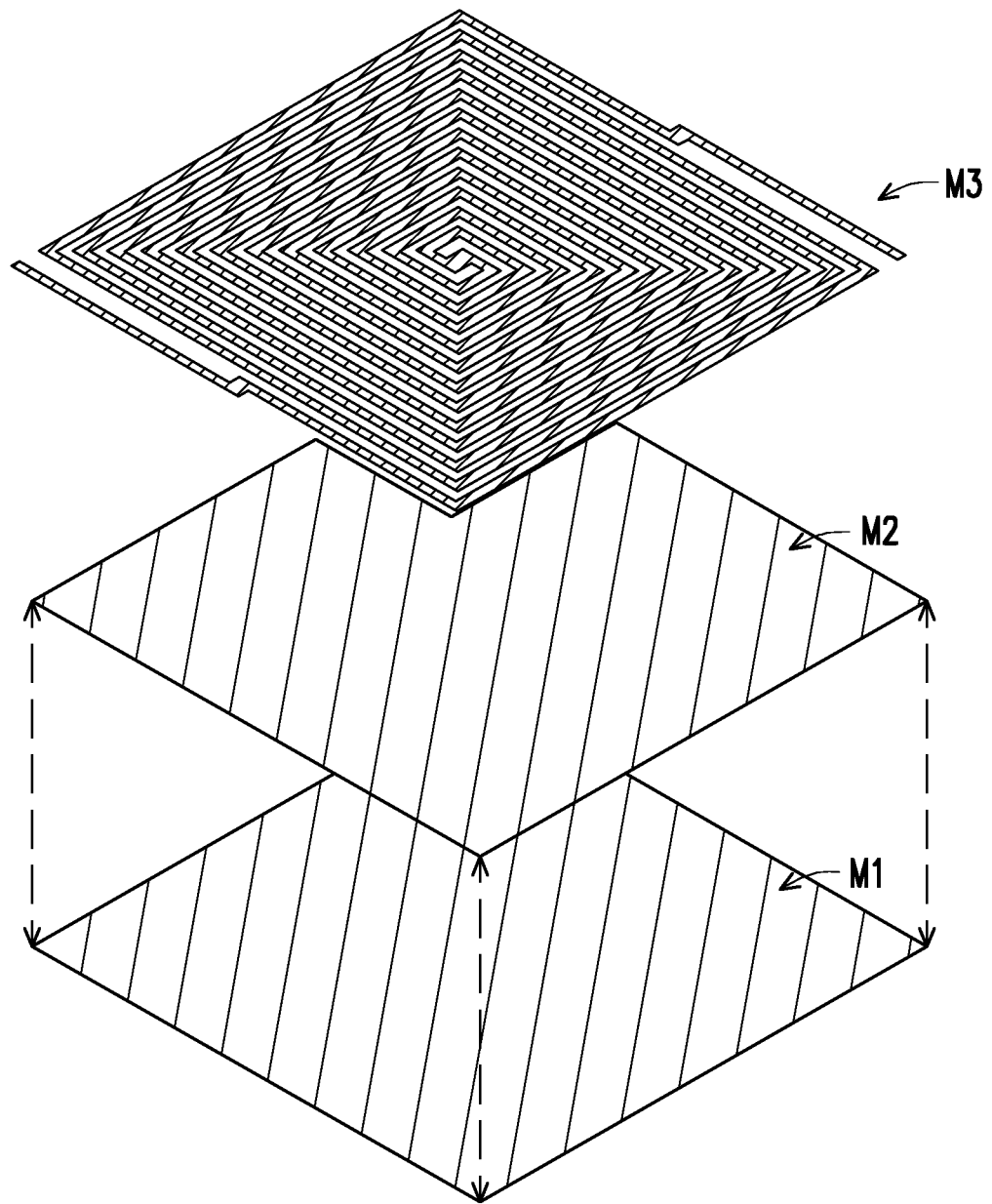
FIG. 16 is a schematic three-dimensional, partially enlarged perspective view of a portion of a package structure according to some embodiments of the disclosure.
Figure 17:
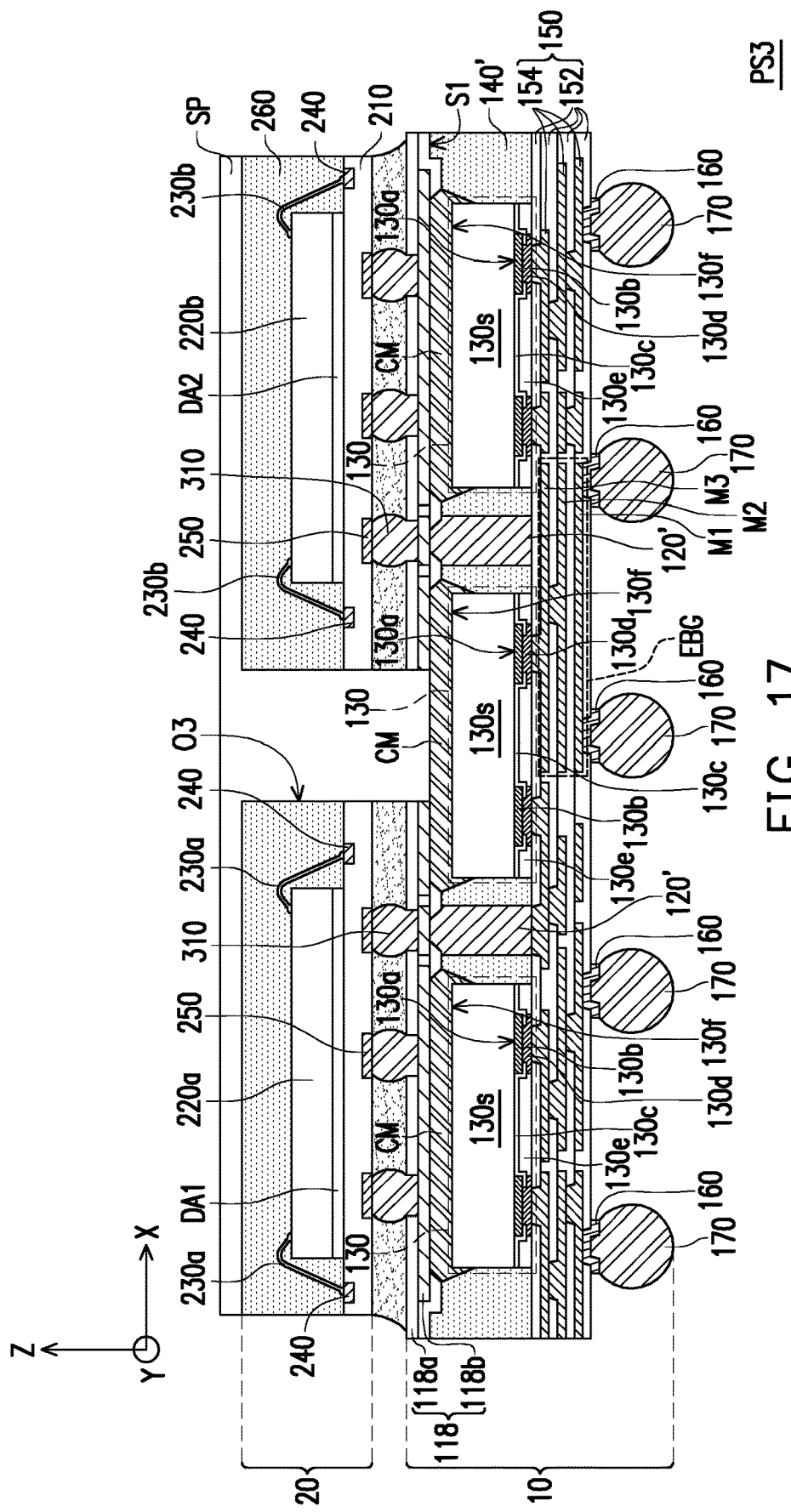
FIG. 17 is a schematic cross-sectional view of a package structure according to some embodiments of the disclosure.

FIG. 14 is a schematic cross-sectional view of a package structure according to some embodiments of the disclosure. FIG. 15A and FIG. 15B are schematic plane views of various modifications of a spiral pattern structure in a package structure according to some embodiments of the disclosure. FIG. 16 is a schematic three-dimensional enlarged perspective view of a portion of a package structure according to some embodiments of the disclosure, where the portion is indicated by a dotted box shown in FIG. 14. FIG. 17 is a schematic cross-sectional view of a package structure according to some embodiments of the disclosure. Referring to FIG. 12 and FIG. 14, the package structure PS2 depicted in FIG. 14 and the package structure PS1 depicted in FIG. 12 are similar; such that the elements similar to or substantially the same as the elements described above will use the same reference numbers, and certain details (e.g. material and formation) or descriptions of the same elements and the relationship thereof (e.g. the relative positioning configuration and electrical connection) will not be repeated herein.

Referring to FIG. 12 and FIG. 14 together, the difference is that, for the package structure PS2 depicted in FIG. 14, the package structure PS2 further includes, in the redistribution circuit structure 150, a first metallization portion M1, a second metallization portion M2 overlapped with and electrically isolated from the first metallization portion M1, and a third metallization portion M3 having a pre-determined pattern. In some embodiments, the first metallization portion M1, the second metallization portion M2, and the third metallization portion M3 each are formed in the same layer with a respective one of the metallization layers 154 of the redistribution circuit structure 150, and thus the material and formation of the first metallization portion M1, the second metallization portion M2, and the third metallization portion M3 are not repeated herein for simplicity.

An occupying area of each of the first metallization portion M1, the second metallization portion M2, and the third metallization portion M3 on the X-Y plane is not limited to the disclosure, which may be selected based on the design layout and demand. In some embodiments, a ratio of the occupying area of each of the first metallization portion M1, the second metallization portion M2, and the third metallization portion M3 on the X-Y plane is approximately ranging from 150 µm to 600 µm. In one embodiment, the occupying areas of the first metallization portion M1, the second metallization portion M2, and the third metallization portion M3 are the same. In an alternative embodiment, the occupying areas of the first metallization portion M1, the second metallization portion M2, and the third metallization portion M3 are different. In a further alternative embodiment, at least two of the occupying areas of the first metallization portion M1, the second metallization portion M2, and the third metallization portion M3 are the same. The disclosure is not limited thereto.

In some embodiments, a positioning location of the first metallization portion M1 and a positioning location of the second metallization portion M2 are overlapped with each other in a vertical projection on the X-Y plane along the direction Z, so that the first metallization portion M1, the second metallization portion M2, and the dielectric layer 152 sandwiched therebetween together work as a capacitor, such capacitor is referred to as a metal-insulator-metal (MIM) capacitor.

In some embodiments, as shown in FIG. 15A, the third metallization portion M3 has a pattern P1 including two spiral portions 410, 420 having aligned centroids thereof. In some embodiments, the spiral portions 410 and 420 are asymmetrical about an axis CL (e.g. a central line of each of the spiral portions 410 and 420, where the centroid of each of the spiral portions 410 and 420 is located thereon) bisecting a width W1 of the spiral pattern P1. In some embodiments, the spiral portion 410 has a first end E1 and a second end E2 and the spiral portion 420 has a first end E3 and a second end E4, where the first end E1 of the spiral portion 410 physically contacts the first end E3 of the spiral portion 420 at a common location located on the axis CL. As shown in FIG. 15A, the first end E1 of the spiral portion 410 and the first end E3 of the spiral portion 420 spiral outwards in opposite direction from the common location at the axis CL to the second end E2 of the spiral portion 410 and the second end E4 of the spiral portion 420, respectively. After spiraling outward, the second end E2 of the spiral portion 410 and the second end E4 of the spiral portion 420 are opposite to and separated from each other. In some embodiments, the width W1 of the pattern P1 is Approximately ranging from 150 µm to 600 µm, while a length L1 of the pattern P1 is approximately ranging from 150 µm to 600 µm. In some embodiments, a width W of the spiral portion 410 or the spiral portion 420 is approximately ranging from 5 µm to 50 µm. In some embodiments, a spacing distance D between the spiral portion 410 and the spiral portion 420 immediately adjacent to each other is approximately ranging from 5 µm to 100 µm. In some embodiments, the spacing distance D is greater than the width W. In some embodiments, a ratio of the width W to the spacing distance D is approximately ranging from 0.5 to 1.

However, the disclosure is not limited thereto. For example, the third metallization portion M3 may a pattern having a plurality of the patterns P1 connected together in series. In alternative embodiments, as shown in FIG. 15B, the third metallization portion M3 has a pattern P2 including two patterns P1 depicted in FIG. 15A, where the two patterns P1 are physically connected to one another through the second ends E2, E4 thereof. In some embodiments, the width W2 of the pattern P2 is approximately ranging from 320 µm to 1220 µm, while a length L2 of the pattern P2 is approximately ranging from 150 µm to 600 µm. For illustration purpose, the number of the patterns P1 included in the pattern P2 depicted in FIG. 15B is two, however, it may be more than two based on the design layout and the demand. The disclosure is not limited.

In some embodiments, no matter considering the pattern P1 or the pattern P2, the first metallization portion M1 is electrically connected to the first end E1 of the spiral portion 410 and/or the first end E3 of the spiral portion 420, while one of the second end E2 of the spiral portion 410 and the second end E4 of the spiral portion 420 (located at the outermost side) is electrically connected to one of a power/ground/signal, and other one of the second end E2 of the spiral portion 410 and the second end E4 of the spiral portion 420 (located at the outermost side) is electrically connected to the semiconductor die 130. In certain embodiments, as shown in the dotted box depicted in FIG. 14, the capacitor including the first metallization portion M1 and the second metallization portion M2 are electrically connected to the third metallization portion M3 electrically connected to the pads 130b of the semiconductor die 130. Owing to such configuration, the third metallization portion M3 and the capacitor including the first metallization portion M1 and the second metallization portion M2 together function as an electromagnetic bandgap (EBG) structure to filter the signal and power noise for the semiconductor die 130. Consequently, the signal integrity and power integrity of the semiconductor die 130 is improved, and the performance efficiency of the package structure PS2 is enhanced. In some embodiments, the electromagnetic bandgap structure includes a three-metal-layer structure (FIG. 16). The electromagnetic bandgap structure may also be referred to as a filter structure in the disclosure.

In alternative embodiments, the dummy dies 330 depicted in FIG. 14 (or the integrated passive devices IPD shown in FIG. 13E to FIG. 13L) may be omitted, partially replaced, or completely replaced with other semiconductor devices (for example, additional semiconductor dies 130), as shown in the package structure PS3 of FIG. 17. Due to the electromagnetic bandgap structure (involving the MIM capacitors), the noise suppression (e.g. at broadband frequency, such as several GHz to several dozen GHz) is obtained, thereby improving the signal integrity and power integrity of the semiconductor die 130, and the performance efficiency of the package structure PS3 is enhanced.

Figure 18:
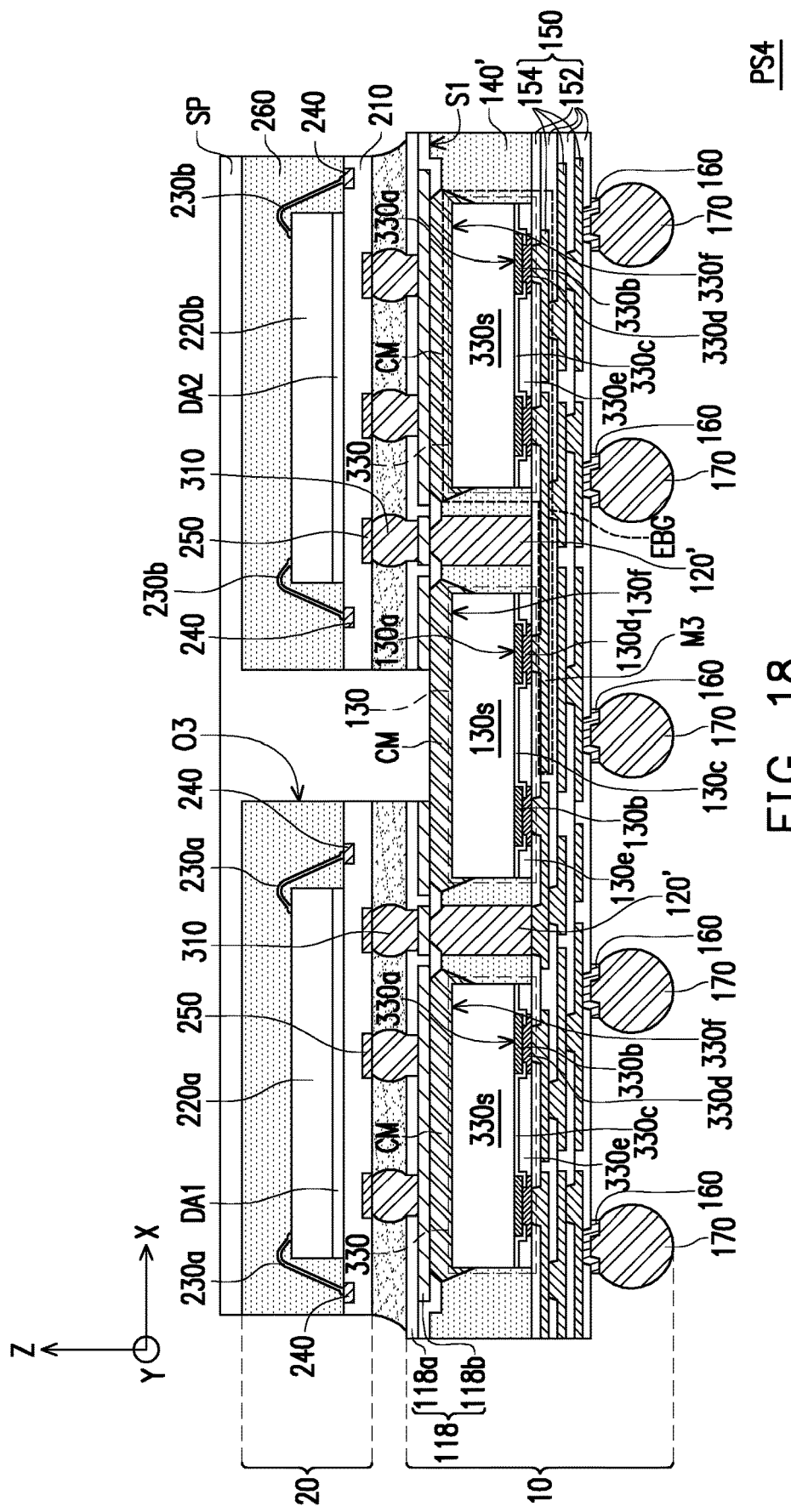
FIG. 18 is a schematic cross-sectional view of a package structure according to some embodiments of the disclosure.

FIG. 18 is a schematic cross-sectional view of a package structure according to some embodiments of the disclosure. Referring to FIG. 14 and FIG. 18, the package structure PS4 depicted in FIG. 18 and the package structure PS2 depicted in FIG. 14 are similar; such that the elements similar to or substantially the same as the elements described above will use the same reference numbers, and certain details (e.g. material and formation) or descriptions of the same elements and the relationship thereof (e.g. the relative positioning configuration and electrical connection) will not be repeated herein. Referring to FIG. 14 and FIG. 18 together, the difference is that, for the package structure PS4 depicted in FIG. 18, the first metallization portion M1 and the second metallization portion M2 are omitted, where at least one of the dummy dies 130 is electrically connected to the metallization layer M3 to form an electromagnetic bandgap structure in a manner similar to the capacitor including the first metallization portion M1 and the second metallization portion M2. Due to the electromagnetic bandgap structure (involving the MOS capacitors providing capacitance adaptive control), the noise suppression (e.g. at broadband frequency, such as several GHz to several dozen GHz) is obtained, thereby improving the signal integrity and power integrity of the semiconductor die 130, and the performance efficiency of the package structure PS4 is enhanced.

According to the embodiments discussed in the package structure PS1 to PS4, a package structure of an alternative embodiment (not shown) of the disclosure may include the applications of one or more than one MOS capacitors, one or more than one integrated passive devices (e.g. capacitors), one or more than one the pi filters, one or more than one electromagnetic bandgap structures involving with MIM capacitor(s), one or more than one electromagnetic bandgap structures involving with MOS capacitor(s), or combinations thereof to improve the signal integrity and power integrity for the active die/chip. Therefore, a performance efficiency of the package structure of such embodiment in the disclosure is further enhanced.

In accordance with some embodiments, a package structure includes an insulating encapsulation, a semiconductor die, and a filter structure. The semiconductor die is encapsulated in the insulating encapsulation. The filter structure is electrically coupled to the semiconductor die, wherein the filter structure includes a patterned metallization layer with a pattern having a double-spiral having aligned centroids thereof.

In accordance with some embodiments, a package structure includes a redistribution circuit structure, a semiconductor die, and a filter element. The semiconductor die is located over and electrically connected to the redistribution circuit structure. The filter element is embedded in the redistribution circuit structure and electrically connected to the redistribution circuit structure and the semiconductor die, wherein the filter element includes a pattern having a double-spiral, wherein the double-spiral includes a first spiral having a first end and second end and a second spiral having a third end and a fourth end, the first end of the first spiral and the third end of the second spiral are connected at a common location on a central line of the pattern, and the first spiral and the second spiral respectively spiral outwards in opposite direction from the first end of the first spiral and the third end of the second spiral to the second end of the first spiral and the fourth end of the second spiral. The plurality of first capacitors are located on the redistribution circuit structure and laterally arranged aside of the semiconductor die, wherein the plurality of first capacitors are electrically coupled to the semiconductor die.

In accordance with some embodiments, a package structure includes a first redistribution circuit structure, a second redistribution circuit structure, a semiconductor die, a first capacitor, and a thermal conductive material. The semiconductor die is located between and electrically connected to the first redistribution circuit structure and the second redistribution circuit structure. The first capacitor is located between and electrically connected to the first redistribution circuit structure and the second redistribution circuit structure and is electrically coupled to the semiconductor die. The thermal conductive material partially penetrates the second redistribution circuit structure and is thermally coupled to the semiconductor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   an insulating encapsulation;
   a semiconductor die, encapsulated in the insulating encapsulation; and
   a filter structure, electrically coupled to the semiconductor die, wherein the filter structure comprises a patterned metallization layer with a pattern having a double-spiral having aligned centroids thereof.

2. The package structure of claim 1, wherein the double-spiral comprises a first spiral having a first end and second end and a second spiral having a third end and a fourth end, wherein the first end of the first spiral and the third end of the second spiral are connected at a common location on a central line of the pattern, and the first spiral and the second spiral respectively spiral outwards in opposite direction from the first end of the first spiral and the third end of the second spiral to the second end of the first spiral and the fourth end of the second spiral.

3. The package structure of claim 1, wherein the double-spiral of the pattern comprises a plurality of the double spirals connected to each other in a series electrical connection,
   wherein the double-spiral comprises a first spiral having a first end and second end and a second spiral having a third end and a fourth end, wherein the first end of the first spiral and the third end of the second spiral are connected at a common location on a central line of the pattern, and the first spiral and the second spiral respectively spiral outwards in opposite direction from the first end of the first spiral and the third end of the second spiral to the second end of the first spiral and the fourth end of the second spiral,
   wherein a second end of one of the plurality of the double spirals is connected to a fourth end of immediately adjacent one of the plurality of the double spirals.

4. The package structure of claim 1, further comprising a capacitor embedded in the insulating encapsulation and arranged aside beside the semiconductor die, wherein the capacitor is electrically connected to the filter structure and electrically coupled to the semiconductor die through the filter structures.

5. The package structure of claim 1, further comprising a capacitor underneath the insulating encapsulation and being free of the insulating encapsulation, wherein the capacitor is electrically connected to the filter structure and electrically coupled to the semiconductor die through the filter structures.

6. A package structure, comprising:
a redistribution circuit structure;
a semiconductor die, located over and electrically connected to the redistribution circuit structure;
a filter element, embedded in the redistribution circuit structure and electrically connected to the redistribution circuit structure and the semiconductor die, wherein the filter element comprises a pattern having a double-spiral, wherein the double-spiral comprises a first spiral having a first end and second end and a second spiral having a third end and a fourth end, the first end of the first spiral and the third end of the second spiral are connected at a common location on a central line of the pattern, and the first spiral and the second spiral respectively spiral outwards in opposite direction from the first end of the first spiral and the third end of the second spiral to the second end of the first spiral and the fourth end of the second spiral; and
a plurality of first capacitors, located on the redistribution circuit structure and laterally arranged aside of the semiconductor die, wherein the plurality of first capacitors are electrically coupled to the semiconductor die.

7. The package structure of claim 6, further comprising:
a plurality of second capacitors, embedded in the redistribution circuit structure and electrically connected to the filter element, wherein the plurality of second capacitors are electrically coupled to the semiconductor die.

8. The package structure of claim 6, wherein some of the plurality of first capacitors are electrically connected to the filter element.

9. The package structure of claim 6, wherein some of the plurality of first capacitors are electrically connected to each other through a portion of the redistribution circuit stricture.

10. The package structure of claim 6, wherein the plurality of the first capacitors comprise MOS capacitors included in a dummy die, integrated passive devices, or a combination thereof.

11. A package structure, comprising:
a first redistribution circuit structure and a second redistribution circuit structure;
a semiconductor die, located between and electrically connected to the first redistribution circuit structure and the second redistribution circuit structure;
a first capacitor, located between and electrically connected to the first redistribution circuit structure and the second redistribution circuit structure and electrically coupled to the semiconductor die, wherein the first capacitor is located beside the semiconductor direction perpendicular to a stacking direction of the first redistribution circuit structure and the second redistribution circuit structure; and
a thermal conductive material, partially penetrating the second redistribution circuit structure and thermally coupled to the semiconductor die.

12. The package structure of claim 11, wherein the first capacitor comprises a MOS capacitor included in a dummy die or an integrated passive device.

13. The package structure of claim 11, wherein the first capacitor comprises a plurality of first capacitor elements, and the plurality of first capacitor elements comprise MOS capacitors included in a dummy die, integrated passive devices, or a combination thereof.

14. The package structure of claim 11, wherein the first capacitor is electrically coupled to the semiconductor die through the first redistribution circuit structure.

15. The package structure of claim 14, wherein the first redistribution circuit structure comprises a filter structure electrically coupled to the semiconductor die, and the filter structure comprises:
a metallization portion having a double-spiral pattern with two spirals having aligned centroids; and
a second capacitor electrically connected to the metallization portion,
wherein the metallization portion is electrically connected to the semiconductor die.

16. The package structure of claim 15, wherein the second capacitor comprises a metal-insulator-metal capacitor.

17. The package structure of claim 14, wherein the first redistribution circuit structure comprises a filter structure electrically coupled to the semiconductor die, and the filter structure comprises:
a metallization portion having a double-spiral pattern with two spirals having aligned centroids,
wherein the metallization portion is electrically coupled to the semiconductor die and the first capacitor.

18. The package structure of claim 11, wherein the thermal conductive material comprises a silver paste or a solder paste.

19. The package structure of claim 11, further comprising:
an insulating encapsulation, encapsulating the semiconductor die and the first capacitor, wherein the insulating encapsulation is sandwiched between the first redistribution circuit structure and the second redistribution circuit structure;
a plurality of through vias, located beside the semiconductor die and the first capacitor and electrically connected to the first redistribution circuit structure and the second redistribution circuit structure;
a plurality of first terminals, located on the first redistribution circuit structure, wherein the first redistribution circuit structure is between the plurality of first terminals and the insulating encapsulation; and
a plurality of second terminals, located on the second redistribution circuit structure, wherein the second redistribution circuit structure is between the plurality of second terminals and the insulating encapsulation.

20. The package structure of claim 19, further comprising:
a second package, comprising at least one semiconductor device and bonded to the second redistribution circuit structure through the plurality of second terminals, wherein at least one recess formed in the second package penetrates through the second package and further extends into the second redistribution circuit structure,
wherein the thermal conductive material is located in the at least one recess and further disposed on a surface of the second package facing away from the second redistribution circuit structure.

* * * * *